United States Patent
Iguchi

(10) Patent No.: US 12,184,035 B2
(45) Date of Patent: Dec. 31, 2024

(54) LIGHT-EMITTING DEVICE, OPTICAL DEVICE, AND MEASUREMENT DEVICE

(71) Applicant: FUJIFILM Business Innovation Corp., Tokyo (JP)

(72) Inventor: Daisuke Iguchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 936 days.

(21) Appl. No.: 17/117,029

(22) Filed: Dec. 9, 2020

(65) Prior Publication Data

US 2021/0265813 A1    Aug. 26, 2021

(30) Foreign Application Priority Data

Feb. 26, 2020    (JP) ................. 2020-030595

(51) Int. Cl.
| | |
|---|---|
| *H01S 5/042* | (2006.01) |
| *G01S 7/484* | (2006.01) |
| *G01S 17/42* | (2006.01) |
| *G01S 17/89* | (2020.01) |
| *H01S 5/024* | (2006.01) |
| *H01S 5/183* | (2006.01) |
| *H01S 5/343* | (2006.01) |
| *H01S 5/42* | (2006.01) |

(52) U.S. Cl.
CPC ............ *H01S 5/042* (2013.01); *G01S 7/484* (2013.01); *G01S 17/42* (2013.01); *G01S 17/89* (2013.01); *H01S 5/02469* (2013.01); *H01S 5/04252* (2019.08); *H01S 5/04254* (2019.08); *H01S 5/18311* (2013.01); *H01S 5/18347* (2013.01); *H01S 5/18361* (2013.01); *H01S 5/3432* (2013.01); *H01S 5/423* (2013.01)

(58) Field of Classification Search
None
See application file for complete search history.

(56) References Cited

U.S. PATENT DOCUMENTS

| | | |
|---|---|---|
| 2008/0043793 A1 | 2/2008 | Ueki et al. |
| 2013/0163626 A1 | 6/2013 | Seurin et al. |
| 2014/0218898 A1 | 8/2014 | Seurin et al. |

(Continued)

FOREIGN PATENT DOCUMENTS

| | | |
|---|---|---|
| CN | 101127433 | 2/2008 |
| CN | 108110619 | 6/2018 |

(Continued)

OTHER PUBLICATIONS

"Office Action of Japan Counterpart Application", issued on Apr. 9, 2024, with English translation thereof, p. 1-p. 4.

(Continued)

*Primary Examiner* — Eric L Bolda
(74) *Attorney, Agent, or Firm* — JCIPRNET

(57) ABSTRACT

A light-emitting device includes a first base member; a laser unit provided on the first base member; a capacitive element that is provided on the first base member and supplies a driving electric current to the laser unit; a wiring board that is constituted by a second base member having lower thermal conductivity than the first base member and on which the first base member is mounted; and a driving unit that is mounted on the wiring board and drives the laser unit.

18 Claims, 11 Drawing Sheets

(56) References Cited

U.S. PATENT DOCUMENTS

| | | |
|---|---|---|
| 2015/0229912 A1 | 8/2015 | Masalkar et al. |
| 2018/0045882 A1 | 2/2018 | Chojnacki et al. |
| 2018/0278011 A1 | 9/2018 | Galvano et al. |
| 2020/0209355 A1* | 7/2020 | Pacala .................... G01S 7/484 |
| 2020/0249320 A1* | 8/2020 | Sakita .................... G01S 17/89 |
| 2021/0075186 A1 | 3/2021 | Zheng et al. |
| 2021/0143607 A1 | 5/2021 | Yasukawa |
| 2021/0245653 A1* | 8/2021 | Sorg .................... B60Q 1/0023 |
| 2021/0265807 A1* | 8/2021 | Iguchi .................. H01S 5/0239 |
| 2021/0265809 A1* | 8/2021 | Iguchi ................ H01S 5/18302 |
| 2021/0265815 A1* | 8/2021 | Iguchi .................. H01S 5/0239 |
| 2022/0109285 A1* | 4/2022 | Yamada ............... H01S 5/0239 |
| 2023/0246424 A1* | 8/2023 | Mitomo ............. H01S 5/18325 |
| | | 372/50.124 |

FOREIGN PATENT DOCUMENTS

| | | |
|---|---|---|
| CN | 110663147 | 1/2020 |
| DE | 102018113711 | 12/2019 |
| JP | 2008252129 | 10/2008 |
| WO | 2019202874 | 10/2019 |

OTHER PUBLICATIONS

"Office Action of Japan Counterpart Application", issued on Dec. 5, 2023, with English translation thereof, p. 1-p. 5.
"Office Action of China Counterpart Application", issued on Sep. 28, 2024, with English translation thereof, p. 1-p. 18.

* cited by examiner

LIGHT-EMITTING DEVICE, OPTICAL DEVICE, AND MEASUREMENT DEVICE

CROSS-REFERENCE TO RELATED APPLICATIONS

This application is based on and claims priority under 35 USC 119 from Japanese Patent Application No. 2020-030595 filed Feb. 26, 2020.

BACKGROUND

(i) Technical Field

The present disclosure relates to a light-emitting device, an optical device, and a measurement device.

(ii) Related Art

Japanese Unexamined Patent Application Publication No. 2008-252129 describes a light-emitting device including a ceramic substrate having light transmission properties, a light-emitting element mounted on a surface of the ceramic substrate, a wiring pattern for supplying power to the light-emitting element, and a metallization layer made of a metal having light reflectivity, the metallization layer being provided in the ceramic substrate so as to reflect light emitted from the light-emitting element.

SUMMARY

Measurement of a three-dimensional shape of an object to be measured according to a Time of Flight (ToF) method using a flight time of light requires reduced inductance of a circuit that supplies a driving electric current to a laser unit and a short rising time of light emission from the laser unit. Furthermore, an improvement in heat release from the laser unit that generates a large amount of heat is required.

Aspects of non-limiting embodiments of the present disclosure relate to a light-emitting device etc. having a structure that easily achieves both a reduction in inductance of a driving circuit and heat release from a laser unit as compared with a case where a capacitive element that supplies a driving electric current to the laser unit is provided outside a first substrate.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including a first base member; a laser unit provided on the first base member; a capacitive element that is provided on the first base member and supplies a driving electric current to the laser unit; a wiring board that is constituted by a second base member having lower thermal conductivity than the first base member and on which the first base member is mounted; and a driving unit that is mounted on the wiring board and drives the laser unit.

BRIEF DESCRIPTION OF THE DRAWINGS

An exemplary embodiment of the present disclosure will be described in detail based on the following figures, wherein:

FIG. 4A is a plan view, and FIG. 4B is a cross-sectional view taken along line IVB-IVB of FIG. 4A;

FIG. 6A is a plan view, and FIG. 6B is a cross-sectional view taken along line VIB-VIB of FIG. 6A;

FIG. 7A illustrates wires provided on the wiring board, FIG. 7B illustrates wires provided on a front surface side of the heat releasing base member, and FIG. 7C illustrates wires provided on a rear surface side of the heat releasing base member;

FIG. 9A is a plan view, and FIG. 9B is a cross-sectional view taken along line IXB-IXB of FIG. 9A;

FIG. 10A illustrates wires provided on the wiring board, FIG. 10B illustrates wires provided on a front surface of the heat releasing base member, and FIG. 10C illustrates wires provided on a rear surface of the heat releasing base member.

DETAILED DESCRIPTION

Figure 1:
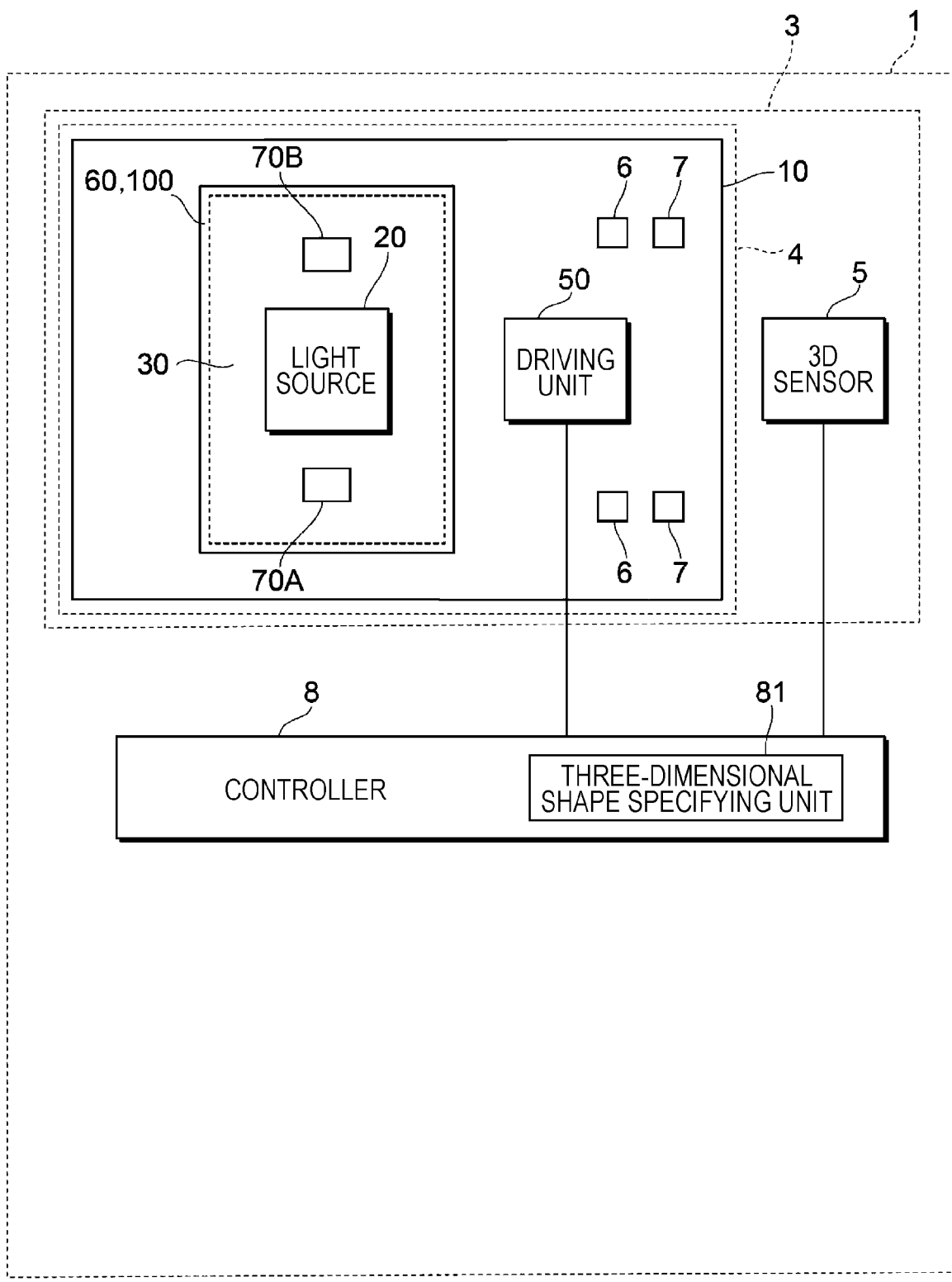
FIG. 1 is a block diagram illustrating an example of a configuration of a measurement device that measures a three-dimensional shape.

An exemplary embodiment of the present disclosure is described in detail below with reference to the attached drawings.

Some measurement devices for measuring a three-dimensional shape of an object to be measured measure a three-dimensional shape according to a Time of Flight (ToF) method using a flight time of light. The TOF method measures a period from a timing of emission of light from a light source of the measurement device to a timing of reception, by a three-dimensional sensor (hereinafter referred to as a 3D sensor) of the measurement device, of light reflected by an object to be measured and specifies a three-dimensional shape of the object to be measured. An object whose three-dimensional shape is to be measured is referred to as an object to be measured. Measurement of a three-dimensional shape may be referred to as three-dimensional measurement, 3D measurement, or 3D sensing.

Such a measurement device is mounted, for example, in a mobile information processing apparatus and is used for face authentication of a user who attempts to access the mobile information processing apparatus. Conventionally, apparatuses such as a mobile information processing apparatus authenticate a user, for example, by using a password, a fingerprint, or an iris. Recently, there are demands for an authentication method of higher security. In response to such demands, recent mobile information processing apparatuses include a measurement device for measuring a three-dimensional shape. That is, a recent mobile information processing apparatus acquires a three-dimensional shape of a face of a user who accessed the mobile information processing apparatus, determines whether or not the user has access permission, and permits the user to use the mobile information processing apparatus only in a case where the user is authenticated as a user having access permission.

Furthermore, such a measurement device is also applied to a case where a three-dimensional shape of an object to be measured is continuously measured (e.g., augmented reality (AR)).

A measurement device that measures a three-dimensional shape according to the ToF method is required to be short in rise time of light emission from a light source. A shorter rise time of light emission from a light source means higher accuracy of measurement. A rise time of light emission from a light source becomes shorter as inductance (circuit inductance) of a driving circuit that drives the light source by supplying an electric current for light emission of the light source becomes smaller. Large circuit inductance causes delay in a high frequency component, thereby prolonging a rise time. That is, it is required to reduce the circuit inductance and thereby shorten a rise time of light emission of the light source. To reduce the circuit inductance, it is effective to shorten a length of a driving circuit that drives the light source by supplying an electric current for light emission of the light source.

The light source generates a large amount of heat. In the case of face authentication, it is only necessary to irradiate a face with light for a short time, but in a case where an object to be measured is continuously irradiated with light (e.g., augmented reality), the light source generates more heat, and therefore the heat is desirably released.

Configurations, functions, methods, and the like described in the exemplary embodiment below can be applied to measurement of a three-dimensional shape of an object to be measured other than face authentication and augmented reality.

Measurement Device 1

FIG. 1 is a block diagram illustrating an example of a configuration of a measurement device 1 that measures a three-dimensional shape.

The measurement device 1 includes an optical device 3 and a controller 8. The controller 8 controls the optical device 3. The controller 8 includes a three-dimensional shape specifying unit 81 that specifies a three-dimensional shape of an object to be measured. The controller 8 is a computer including a CPU, a ROM, and a RAM. Examples of the ROM include a non-volatile rewritable memory such as a flash memory. Programs and constant numbers accumulated in the ROM are loaded into the RAM, and the CPU executes the programs. This realizes the three-dimensional shape specifying unit 81 that specifies a three-dimensional shape of an object to be measured.

These members are described below in order.

The optical device 3 includes a light-emitting device 4 and a 3D sensor 5.

The light-emitting device 4 includes a wiring board 10, a heat releasing base member 100, a light source 20, a light diffusion member 30, a driving unit 50, a holding unit 60, and capacitors 70A and 70B. Furthermore, the light-emitting device 4 may include passive elements such as a resistive element 6 and a capacitor 7 for causing the driving unit 50 to operate. In this example, it is assumed that the light-emitting device 4 includes two resistive elements 6 and two capacitors 7. Although two capacitors 70A and 70B are illustrated, only a single capacitor 70 may be provided. In a case where the capacitors 70A and 70B are not distinguished from each other, the capacitors 70A and 70B are referred to as capacitors 70. Furthermore, the number of resistive elements 6 and the number of capacitors 7 may be one or may be more than one. Electric components such as the 3D sensor 5, the resistive elements 6, and the capacitors 7 other than the light source 20, the driving unit 50, and the capacitors 70 are sometimes collectively referred to as circuit components. The 3D sensor 5 is an example of a light receiving unit. The capacitors 70 (the capacitors 70A and 70B) are an example of a capacitive element.

The heat releasing base member 100, the driving unit 50, the resistive elements 6, and the capacitors 7 of the light-emitting device 4 are provided on a front surface of the wiring board 10. Although the 3D sensor 5 is not provided on the front surface of the wiring board 10 in FIG. 1, the 3D sensor 5 may be provided on the front surface of the wiring board 10.

The light source 20, the capacitors 70A and 70B, and the holding unit 60 are provided on a front surface of the heat releasing base member 100. The light diffusion member 30 is provided on the holding unit 60. In this example, it is assumed that an external shape of the heat releasing base member 100 is identical to an external shape of the light diffusion member 30. These configurations will be described later with reference to FIG. 6 through 8. The "front surface" as used herein refers to a front side of the paper on which FIG. 1 is drawn. More specifically, a side of the wiring board 10 on which the heat releasing base member 100 is provided is referred to as a front surface, a front side, or a front surface side. A side of the heat releasing base member 100 on which the light source 20 is provided is referred to as a front surface, a front side, or a front surface side.

The light source 20 is a light-emitting element array including plural light-emitting elements that are two-dimensionally arranged (see FIG. 2, which will be described later). The light-emitting elements are, for example, vertical cavity surface emitting lasers (VCSELs). In the following description, it is assumed that the light-emitting elements are vertical cavity surface emitting lasers (VCSELs). The vertical cavity surface emitting lasers (VCSELs) are hereinafter referred to as VCSELs. Since the light source 20 is provided on the front surface of the heat releasing base member 100, the light source 20 emits light in a direction perpendicular to the front surface of the heat releasing base member 100 away from the heat releasing base member 100. That is, the light-emitting element array is a surface emitting laser element array. Since the plural light-emitting elements of the light source 20 are two-dimensionally arranged, a surface of the light source 20 from which light is emitted is sometimes referred to as an emission surface. The light source 20 is an example of a laser unit.

The light diffusion member 30 receives light emitted from the light source 20. Then, the light diffusion member 30 diffuses the incident light and outputs the diffused light. The light diffusion member 30 is provided so as to cover the light source 20 and the capacitors 70A and 70B. Specifically, the light diffusion member 30 is provided so as to be spaced apart by a predetermined distance from the light source 20 and the capacitors 70A and 70B provided on the heat releasing base member 100 by the holding unit 60 provided on the front surface of the heat releasing base member 100.

Accordingly, light emitted from the light source 20 reaches an object to be measured after being diffused by the light diffusion member 30. That is, the light emitted by the light source 20 is radiated in a wider range by being diffused by the light diffusion member 30 than in a case where the light diffusion member 30 is not provided.

In a case where three-dimensional measurement is performed by using the ToF method, the light source 20 is required to emit, for example, pulsed light (hereinafter referred to as an emitted light pulse) of 100 MHz or more whose rise time is 1 ns or less by the driving unit 50. In an example of face authentication, a distance over which light is radiated is approximately 10 cm to approximately 1 m, and a range irradiated with light is approximately 1 m square. The distance over which light is radiated is referred to as a measurement distance, and the range irradiated with light is referred to as an irradiation range or a measurement range. A plane virtually provided in the irradiation range or the measurement range is referred to as an irradiation plane. In cases other than face authentication, the measurement distance to the object to be measured and the irradiation range of the object to be measured may be different from those described above.

The 3D sensor 5 includes plural light receiving cells and outputs a signal corresponding to a period from emission of light from the light source 20 to reception of the light by the 3D sensor 5. For example, each of the light receiving cells of the 3D sensor 5 receives pulsed light (hereinafter referred to as a received pulse) that is an emitted pulse from the light source 20 reflected by an object to be measured and accumulates an electric charge corresponding to a period to the reception of the light. The 3D sensor 5 is a device having a CMOS structure in which each light receiving cell includes two gates and electric charge accumulating units corresponding to the two gates. By alternately applying a pulse to the two gates, a generated photoelectron is transferred to any of the two electric charge accumulating units at a high speed. In the two electric charge accumulating units, an electric charge according to a phase difference between an emitted light pulse and a received pulse is accumulated. The 3D sensor 5 outputs, as a signal for each light receiving cell, a digital value according to a phase difference between an emitted light pulse and a received pulse through an AD converter. That is, the 3D sensor 5 outputs a signal corresponding to a period from emission of light from the light source 20 to reception of the light by the 3D sensor 5. Accordingly, a signal corresponding to a three-dimensional shape of the object to be measured is acquired from the 3D sensor 5. The AD converter may be provided in the 3D sensor 5 or may be provided outside the 3D sensor 5.

The three-dimensional shape specifying unit 81 of the controller 8 acquires a digital value obtained for each light receiving cell and calculates a distance to the object to be measured for each light receiving cell in a case where the 3D sensor 5 is, for example, a device having a CMOS structure as described above. Then, the three-dimensional shape specifying unit 81 specifies a three-dimensional shape of the object to be measured based on the calculated distance and outputs the specified three-dimensional shape. A signal corresponding to the three-dimensional shape can be acquired.

As described above, the controller 8 is a computer, and the three-dimensional shape specifying unit 81 is realized by a program. However, these members may be realized by an integrated circuit such as an ASIC or an FPGA. Alternatively, these members may be realized by software such as a program and an integrated circuit such as an ASIC.

As described above, the measurement device 1 diffuses light emitted from the light source 20, irradiates an object to be measured with the diffused light, and causes the 3D sensor 5 to receive the light reflected by the object to be measured. In this way, the measurement device 1 measures a three-dimensional shape of the object to be measured. This shows that the light source 20 is required to have large output not only in face authentication, but also measurement of a three-dimensional shape such as augmented reality. It is therefore required to efficiently release heat from the light source 20.

Although the optical device 3 and the controller 8 are separately illustrated in FIG. 1, the optical device 3 and the controller 8 may be integral with each other.

First, the light source 20, the light diffusion member 30, the driving unit 50, and the capacitors 70A and 70B that constitute the light-emitting device 4 are described. Configuration of Light Source 20

Figure 2:
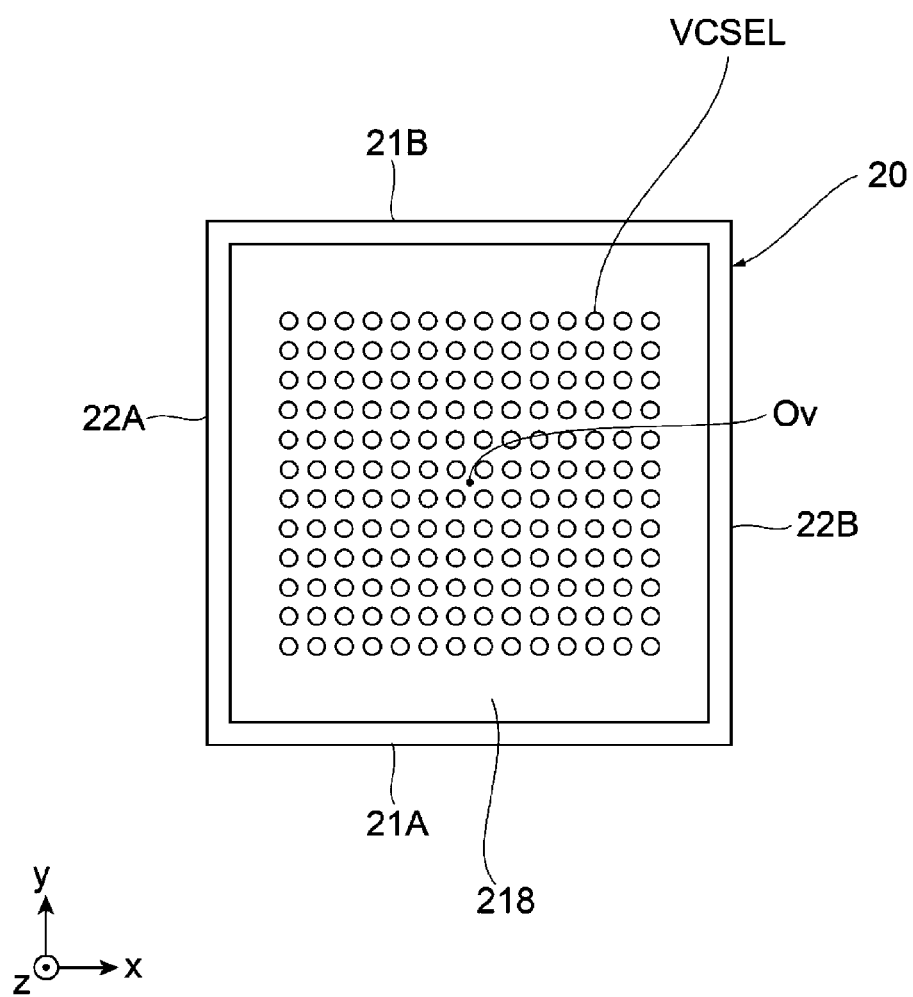
FIG. 2 is a plan view of a light source.

FIG. 2 is a plan view of the light source 20. The light source 20 is constituted by plural VCSELs that are arranged in a two-dimensional array. That is, the light source 20 is a light-emitting element array using the VCSELS as light-emitting elements. It is assumed that the rightward direction and the upward direction of the paper on which FIG. 2 is drawn are an x direction and a y direction, respectively. A direction orthogonal to the x direction and the y direction in anticlockwise direction is a z direction. Note that the front surface of the light source 20 is a front side of the paper on which FIG. 2 is drawn, that is, a surface on a +z direction side, and a rear surface of the light source 20 is a rear side of the paper on which FIG. 2 is drawn, that is, a surface on a −z direction side. The plan view of the light source 20 is a view illustrating the light source 20 from the front surface side. More specifically, a side of the light source 20 on which an epitaxial layer functioning as a light emission layer (an active region 206, which will be described later) is provided is referred to as a front surface, a front side, or a front surface side of the light source 20.

Each of the VCSELs is a light-emitting element configured such that an active region that serves as a light-emitting region is provided between a lower multilayer film reflector and an upper multilayer film reflector stacked on a semiconductor substrate 200 (see FIG. 3, which will be described later) and emits laser light in a direction perpendicular to a surface of the semiconductor substrate 200. It is therefore easier to arrange the VCSELS in a two-dimensional array than in a case where end-surface emission type lasers are used. The number of VCSELS included in the light source 20 is, for example, 100 to 1000. The plural VCSELs are connected in parallel and are driven in parallel. The number of VCSELs described above is an example and need just be set in accordance with the measurement distance and the irradiation range.

An anode electrode 218 (see FIG. 3, which will be described later) common to the plural VCSELs is provided on the front surface of the light source 20. A cathode electrode 214 is provided on a rear surface of the light source 20 (see FIG. 3, which will be described later). That is, the plural VCSELs are connected in parallel. In a case where the plural VCSELs are connected in parallel and driven in parallel, light of a higher intensity is emitted than in a case where the VCSELs are individually driven.

It is assumed here that the light source 20 is configured such that a shape thereof (hereinafter referred to as a planar shape) viewed from the front surface side is rectangular. A side surface on a −y direction side, a side surface on a +y direction side, a side surface on a −x direction side, and a side surface on a +x direction side are referred to as a side surface 21A, a side surface 21B, a side surface 22A, and a side surface 22B, respectively. The side surface 21A and the side surface 21B face each other. The side surface 22A and the side surface 22B connect the side surface 21A and the side surface 21B and face each other.

A center of the light source 20 in the planar shape, that is, a center of the light source 20 in the x direction and the y direction is referred to as a center 0v.

Structure of VCSEL

Figure 3:
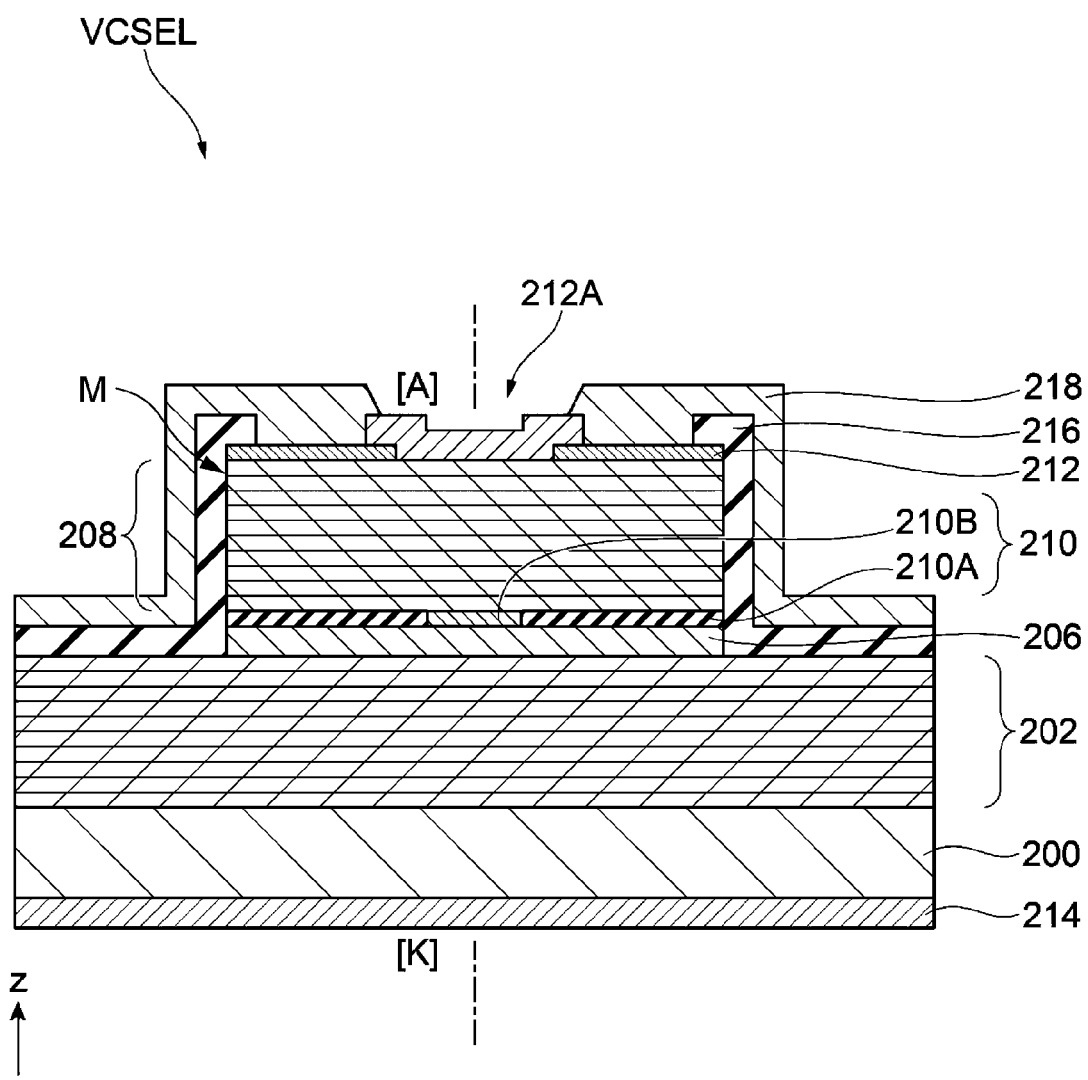
FIG. 3 is a view for explaining a cross-sectional structure of a single VCSEL of the light source.

FIG. 3 is a view for explaining an example of a cross-sectional structure of a single VCSEL in the light source 20. The VCSEL is a VCSEL having a λ resonator structure. The upward direction of the paper on which FIG. 3 is drawn is the z direction, and a +z direction is referred to as an upper side, and a −z direction is referred to as a lower side.

The VCSEL is configured such that an n-type lower distributed bragg reflector (DBR) 202 in which AlGaAs layers having different Al compositions are alternately stacked, an active region 206 including a quantum well layer sandwiched between an upper spacer layer and a lower spacer layer, and a p-type upper distributed bragg reflector 208 in which AlGaAs layers having different Al compositions are alternately stacked are stacked in order on the semiconductor substrate 200 such as n-type GaAs. Hereinafter, a distributed bragg reflector is referred to as a DBR.

The n-type lower DBR 202 is a multilayer body including pairs of an $Al_{0.9}Ga_{0.1}As$ layer and an GaAs layer, each of the layers has a thickness of $\lambda/4n_r$ ($\lambda$ is an oscillation wavelength, and $n_r$ is a refractive index of a medium), and 40 pairs of these layers are stacked so that these layers are alternately provided. The n-type lower DBR 202 is doped with silicon, which is an n-type impurity, as a carrier. A carrier concentration, is, for example, $3\times10^{18}$ $cm^{-3}$.

The active region 206 is configured such that the lower spacer layer, the quantum well active layer, and the upper spacer layer are stacked. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 208 is a multilayer body including pairs of a p-type $Al_{0.9}Ga_{0.1}As$ layer and a GaAs layer. Each of the layers of the p-type upper DBR 208 has a thickness of $\lambda/4n_r$, and 29 pairs of these layers are stacked so that these layers are alternately provided. The p-type upper DBR 208 is doped with carbon, which is a p-type impurity, as a carrier. A carrier concentration is, for example, $3\times10^{18}$ $cm^{-3}$. Desirably, a contact layer made of p-type GaAs is formed in a topmost layer of the upper DBR 208, and a p-type AlAs current confinement layer 210 is formed in a lowermost layer of the upper DBR 208 or in an inner part of the upper DBR 208.

By etching a semiconductor layer stacked from the upper DBR 208 to the lower DBR 202, a cylindrical mesa M is formed on the semiconductor substrate 200. This causes the current confinement layer 210 to be exposed on a side surface of the mesa M. An oxidized region 210A oxidized from the side surface of the mesa M and an electrically-conductive region 210B surrounded by the oxidized region 210A are formed in the current confinement layer 210 by an oxidation process. In the oxidation process, an oxidation speed of the AlAs layer is higher than an oxidation speed of the AlGaAs layer, and the oxidized region 210A is oxidized from the side surface of the mesa M toward an inside of the mesa M at an almost constant speed, and therefore a cross-sectional shape of the electrically-conductive region 210B becomes a shape reflecting an external shape of the mesa M, i.e., a circular shape, and a center of the shape almost matches an axis (indicated by the line with alternate long and short dashes) of the mesa M. In the present exemplary embodiment, the mesa M has a columnar structure.

An annular p-side electrode 212 made of a metal in which Ti/Au and the like are stacked is formed in a topmost layer of the mesa M. The p-side electrode 212 makes ohmic-contact with the contact layer provided in the upper DBR 208. An inner side of the annular p-side electrode 212 serves as a light outlet 212A through which laser light is emitted to an outside. That is, the VCSEL emits light in a direction perpendicular to a front surface (a surface on the +z direction side) of the semiconductor substrate 200. The axis of the mesa M is an optical axis. Furthermore, the cathode electrode 214 is formed as an n-side electrode on the rear surface of the semiconductor substrate 200. Note that a front surface (a surface on the +z direction side) of the upper DBR 208 on an inner side of the p-side electrode 212 is a light emission surface. That is, an optical axis direction of the VCSELs is a light emission direction.

An insulating layer 216 is provided so as to cover the front surface of the mesa M excluding a part of the p-side electrode 212 to which the anode electrode 218 is connected and the light outlet 212A. The anode electrode 218 is provided so as to make ohmic-contact with the p-side electrode 212 excluding the light outlet 212A. The anode electrode 218 is provided common to the plural VCSELs. That is, the p-side electrodes 212 of the plural VCSELs that constitute the light source 20 are connected in parallel by the anode electrode 218.

In FIG. 3, the anode electrode 218 is indicated by [A] indicative of an anode, and the cathode electrode 214 is indicated by [K] indicative of a cathode.

The VCSEL may oscillate in a single transverse mode or may oscillate in a multiple transverse mode. Light output of a single VCSEL is, for example, 4 mW to 8 mW. Accordingly, for example, in a case where the light source 20 is constituted by 500 VCSELs, light output of the light source 20 is 2 W to 4 W. Such a large-output light source 20 generates a large amount of heat. It is therefore required to efficiently release heat from the light source 20.

Configuration of Light Diffusion Member 30

Figure 4A:
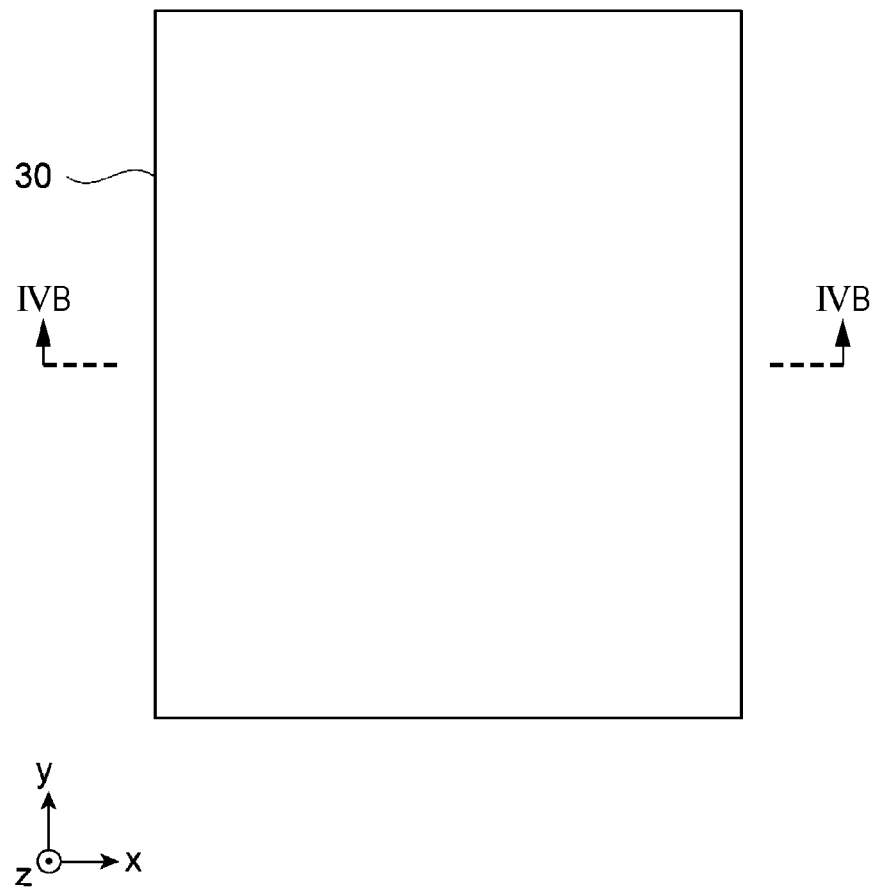
FIGS. 4A and 4B are views for explaining an example of a light diffusion member.
Figure 4B:
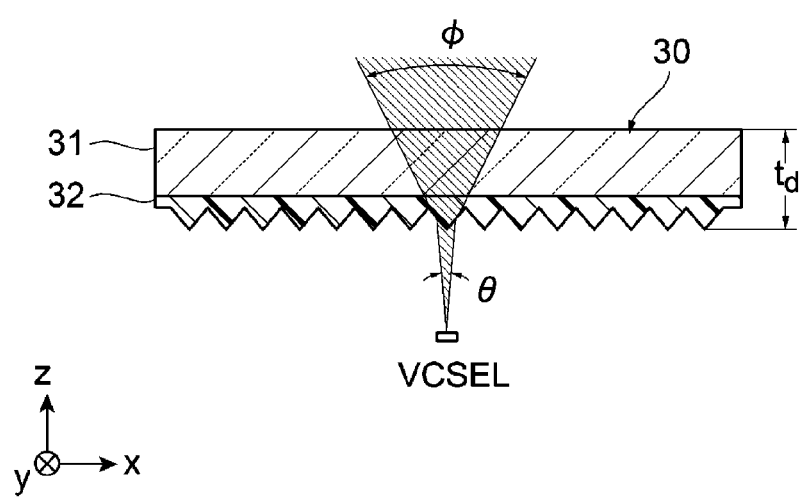

FIGS. 4A and 4B are views for explaining an example of the light diffusion member 30. FIG. 4A is a plan view, and FIG. 4B is a cross-sectional view taken along line IVB-IVB of FIG. 4A. In FIG. 4A, it is assumed that the rightward direction and the upward direction of the paper on which FIG. 4A is drawn are the x direction and the y direction, respectively. It is assumed that a direction orthogonal to the x direction and the y direction in anticlockwise direction is the z direction. A surface of the light diffusion member 30 on the +z direction side is referred to as a front surface or a front surface side, and a surface of the light diffusion member 30 on the −z direction side is referred to as a rear surface or a rear surface side. Accordingly, in FIG. 4B, the rightward direction, the depth direction, and the upward direction of the paper on which FIG. 4B is drawn are the x direction, the y direction, and the z direction, respectively.

As illustrated in FIG. 4B, the light diffusion member 30 includes a resin layer 32 having irregularities for diffusing light, for example, on a rear surface (−z direction) side of a glass substrate 31 whose both surfaces are parallel and flat. The light diffusion member 30 widens a spread angle of light incident from the VCSELs of the light source 20. That is, the irregularities of the resin layer 32 of the light diffusion member 30 refract and scatter light so that incident light is output as light having a wider spread angle. That is, as illustrated in FIG. 4B, the light diffusion member 30 causes light having a spread angle θ emitted from the VCSELs and incident from the rear surface (−z direction side) to be output as light having a spread angle φ, which is larger than θ, from the front surface (+z direction side) (θ<φ). This means that use of the light diffusion member 30 increases an area of an irradiation surface irradiated with light emitted from the light source 20 as compared with a case where the light diffusion member 30 is not used. The spread angles θ and φ are full width at half maximum (FWHM).

The light diffusion member 30 is, for example, configured such that a planar shape thereof is identical to the planar shape of the heat releasing base member 100 and a thickness $t_d$ (a thickness in the z direction) thereof is 0.1 mm to 1 mm. The planar shape of the light diffusion member 30 may be any of other shapes such as a polygonal shape or a circular shape.

Driving Unit 50 and Capacitors 70A and 70B

In a case where the light source 20 is driven at a higher speed, the light source 20 is desirably driven by low-side driving. The low-side driving refers to a configuration in which a driving element such as an MOS transistor is located on a downstream side of an electric current path relative to a target to be driven such as a VCSEL. Conversely, a configuration in which a driving element is located on an upstream side is referred to as high-side driving.

Figure 5:
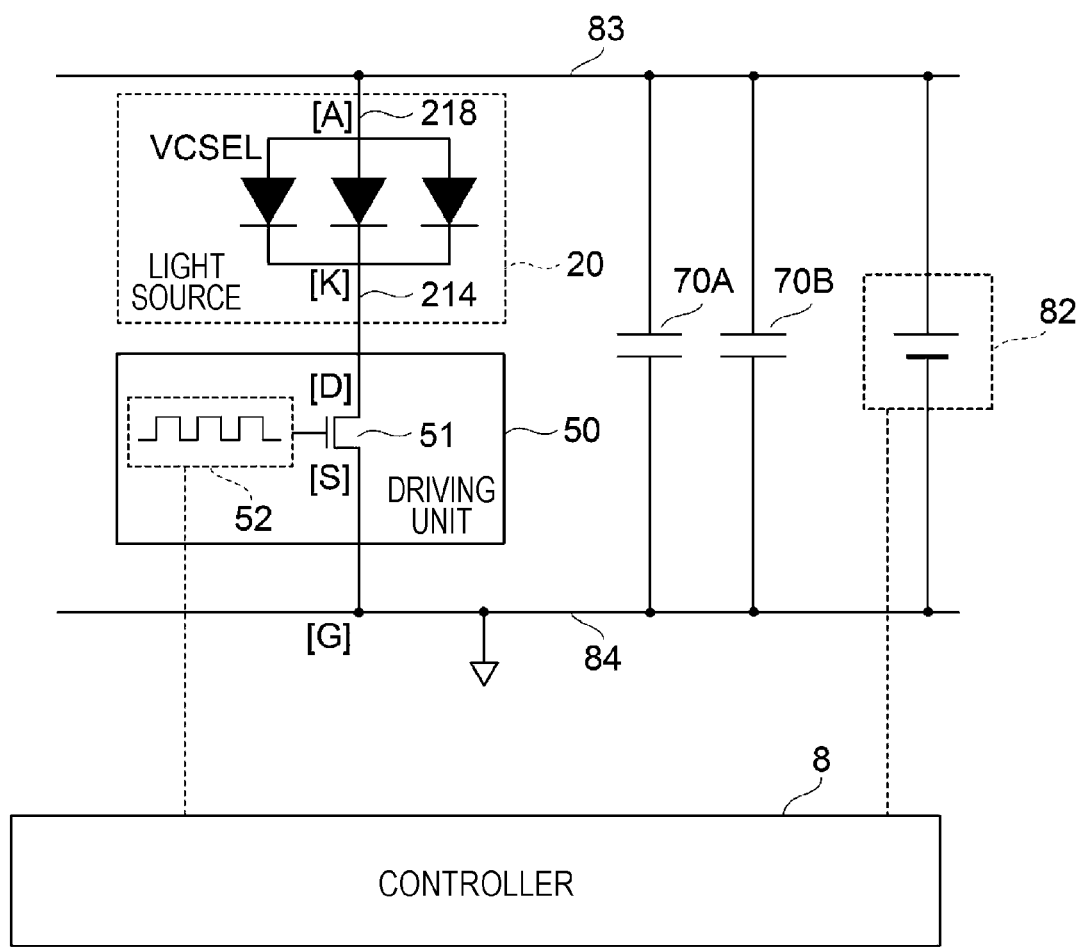
FIG. 5 illustrates an example of an equivalent circuit in a case where the light source is low-side driven.

FIG. 5 illustrates an example of an equivalent circuit for driving the light source 20 by low-side driving. FIG. 5 illustrates VCSELs of the light source 20, the driving unit 50, the capacitors 70A and 70B, and a power source 82. The power source 82 is provided in the controller 8 illustrated in FIG. 1. The power source 82 generates a direct-current voltage whose+side is a power source potential and whose−side is a reference potential. The power source potential is supplied to a power source line 83, and the reference potential is supplied to a reference line 84. The reference potential may be a ground potential (also referred to as GND; indicated by "G" in FIG. 5).

The light source 20 is constituted by plural VCSELS that are connected in parallel, as described above. The anode electrode 218 (see FIG. 3; indicated by [A] in FIG. 5) of the VCSELs is connected to the power source line 83.

The driving unit 50 includes an n-channel MOS transistor 51 and a signal generating circuit 52 that turns the MOS transistor 51 on an off. A drain (indicated by [D] in FIG. 5) of the MOS transistor 51 is connected to the cathode electrode 214 (see FIG. 3; indicated by [K] in FIG. 5)) of the VCSELs. A source (indicated by [S] in FIG. 5) of the MOS transistor 51 is connected to the reference line 84. A gate of the MOS transistor 51 is connected to the signal generating circuit 52. That is, the VCSELs and the MOS transistor 51 of the driving unit 50 are connected in series between the power source line 83 and the reference line 84. The signal generating circuit 52 generates an "H level" signal that turns the MOS transistor 51 on and an "L level" signal that turns the MOS transistor 51 off under control of the controller 8.

One terminal of the capacitor 70A and one terminal of the capacitor 70B are connected to the power source line 83, and the other terminal of the capacitor 70A and the other terminal of the capacitor 70B are connected to the reference line 84. In a case where plural capacitors 70 are provided, the plural capacitors 70 are connected in parallel. Specifically, in FIG. 5, the capacitors 70 are two capacitors 70A and 70B. The capacitors 70 are, for example, electrolytic capacitors or ceramic capacitors.

Next, a driving method for driving the light source 20 by low-side driving is described.

First, it is assumed that a signal generated by the signal generating circuit 52 of the driving unit 50 is an "L level". In this case, the MOS transistor 51 is in an off state. That is, no electric current flows between the source (indicated by [S] in FIG. 5) and the drain (indicated by [D] in FIG. 5) of the MOS transistor 51. Accordingly, no electric current flows through the VCSELs that are connected in series with the MOS transistor 51. That is, the VCSELs do not emit light.

In this state, the capacitors 70A and 70B are connected to the power source 82, the one terminal of the capacitor 70A and the one terminal of the capacitor 70B that are connected to the power source line 83 become a power source potential, and the other terminal of the capacitor 70A and the other terminal of the capacitor 70B that are connected to the reference line 84 become a reference potential. Accordingly, the capacitors 70A and 70B are charged with an electric current flowing (an electric charge supplied) from the power source 82.

Next, when the signal generated by the signal generating circuit 52 of the driving unit 50 becomes an "H level", the MOS transistor 51 shifts from an off state to an on state. As a result, the capacitors 70A and 70B, and the MOS transistor 51 and the VCSELs that are connected in series constitute a closed loop. This causes the electric charge accumulated in the capacitors 70A and 70B to be supplied to the MOS transistor 51 and the VCSELs that are connected in series. That is, an electric current flows through the VCSELs, and the VCSELs emit light. This closed loop is a driving circuit that drives the light source 20.

Then, when the signal generated by the signal generating circuit 52 of the driving unit 50 becomes an "L level" again, the MOS transistor 51 shifts from an on state to an off state. This opens the closed loop (driving circuit) constituted by the capacitors 70A and 70B, and the MOS transistor 51 and the VCSELs that are connected in series. As a result, an electric current does not flow through the VCSELs. Accordingly, the VCSELs stop light emission. The capacitors 70A and 70B are charged with an electric current flowing (an electric charge supplied) from the power source 82.

As described above, when the signal output by the signal generating circuit 52 repeatedly switches between the "H level" and the "L level", the MOS transistor 51 repeatedly turns on and off, and the VCSELs repeatedly switch between light emission and non-light-emission. The repeated on and off of the MOS transistor 51 is sometimes referred to as switching.

As described above, by discharging the electric charges accumulated in the capacitors 70A and 70B at once when the MOS transistor 51 is shifted from an off state to an on state, the electric charges are supplied as a driving electric current to the VCSELs. This allows the VCSELs to emit light in a short rise time (e.g., 1 ns or less). After light emission of the VCSELs stops, a longer time than the rise time is taken to supply electric charges from the power source 82 to the capacitors 70A and 70B (charge the capacitors 70A and 70B). Although the driving electric current may be directly supplied from the power source 82 to the VCSELs without the capacitors 70A and 70B, this configuration makes a path for supplying an electric current longer, thereby making a rise time of light emission of the VCSELs longer.

As described above, the driving electric current is supplied at once to the VCSELs by low-side driving using the capacitors 70A and 70B, a rise time of light emission of the VCSELs is shortened. To shorten a rise time of light emission of the VCSELs, circuit inductance of a driving circuit that is constituted by the capacitors 70A and 70B and the MOS transistor 51 and the VCSELs that are connected in series and supplies a driving electric current for light emission to the light source 20 is desirably small. To reduce the circuit inductance, it is more desirable to make a path along which the driving electric current flows in the driving circuit shorter. It is therefore desirable to shorten a distance between the light source 20 and the driving unit 50 and distances from the light source 20 to the capacitors 70A and 70B, thereby shortening a wire connecting the light source 20 and the driving unit 50 and a wire connecting the light source 20 and the capacitors 70A and 70B.

Light-Emitting Device 4

Next, the light-emitting device 4 is described in detail.

Figure 6A:
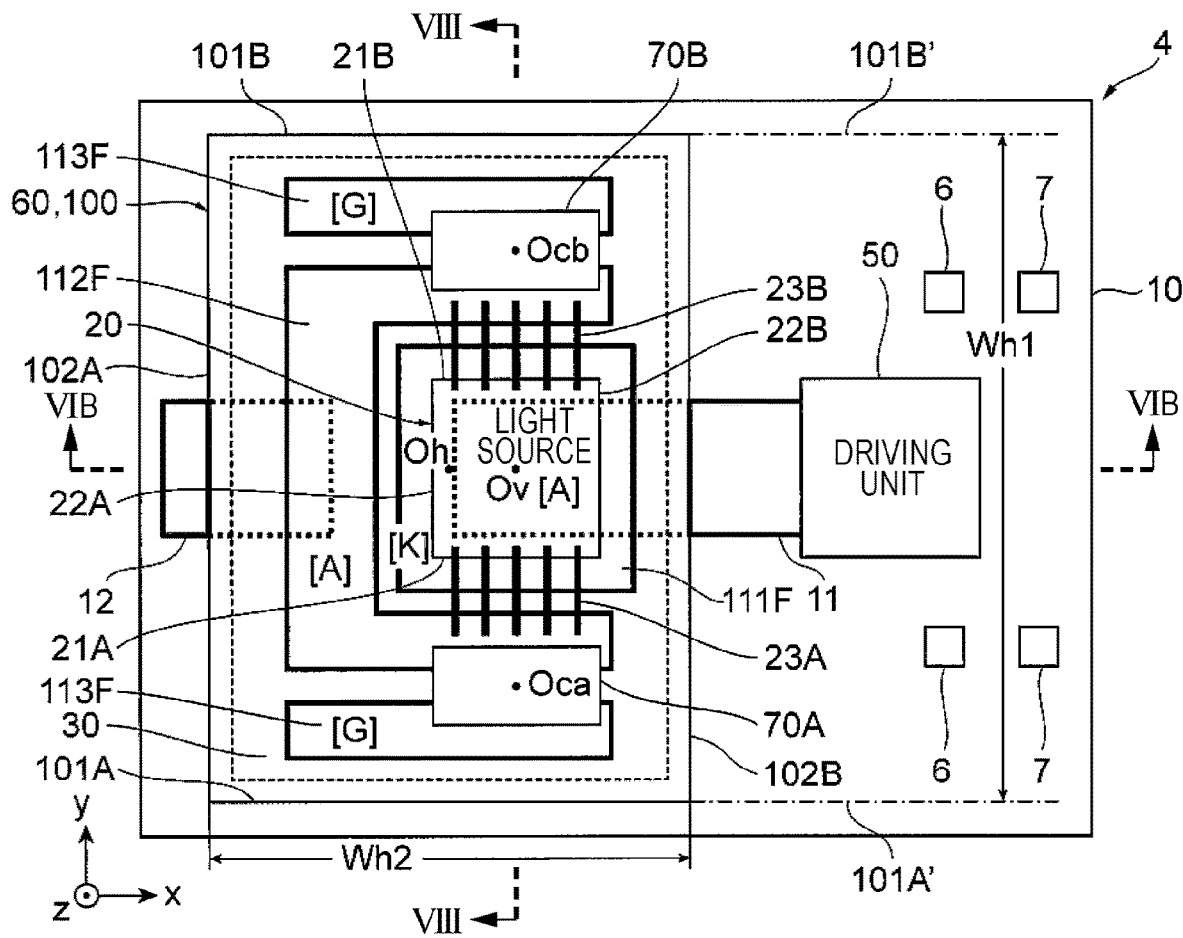
FIGS. 6A and 6B are views for explaining a light-emitting device to which the present exemplary embodiment is applied.
Figure 6B:
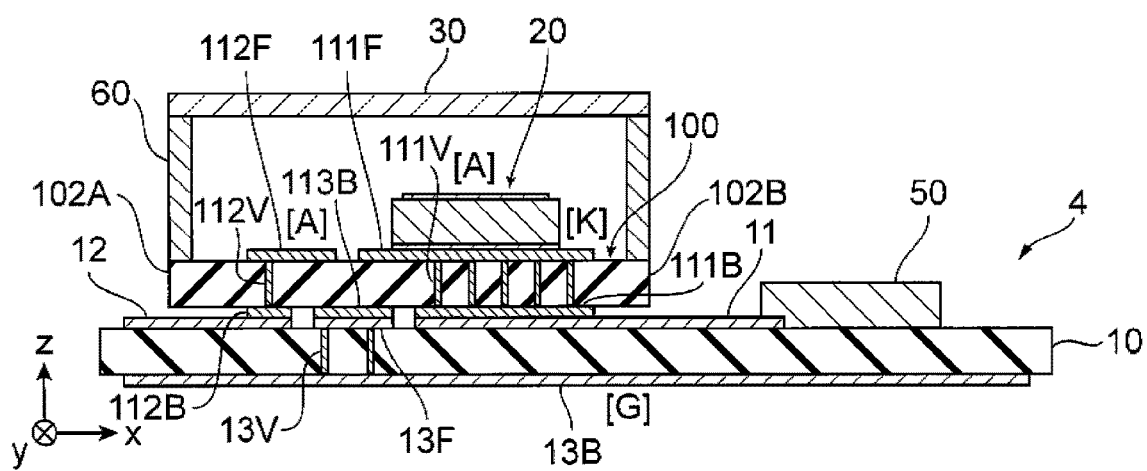

FIGS. 6A and 6B are views for explaining the light-emitting device 4 to which the present exemplary embodiment is applied. FIG. 6A is a plan view, and FIG. 6B is a cross-sectional view taken along line VIB-VIB of FIG. 6A. FIG. 6A is a view seen through the light diffusion member 30. In FIG. 6A, it is assumed that the rightward direction and the upward direction of the paper on which FIG. 6A is drawn are the x direction and the y direction, respectively. It is assumed that a direction (frontward direction of the paper on which FIG. 6A is drawn) orthogonal to the x direction and the y direction in anticlockwise direction is the z direction. As for the members described below (such as the wiring board 10, the heat releasing base member 100, and the light diffusion member 30), a front side (+z direction) of the paper is referred to as a front surface or a front surface side, and a rear side (−z direction) of the paper is referred to as a rear surface or a rear surface side. Seeing through the members from the front surface side is referred to as top view. In FIG. 6B, the rightward direction of the paper is the x direction, the rearward direction of the paper is the y direction, and the upward direction of the paper is the z direction.

As illustrated in FIGS. 6A and 6B, the heat releasing base member 100, the driving unit 50, the resistive elements 6, and the capacitors 7 are provided on a front surface of the wiring board 10. The light source 20, the capacitors 70A and 70B, and the holding unit 60 are provided on a front surface of the heat releasing base member 100. The light diffusion member 30 is provided on the holding unit 60.

The wiring board 10 is, for example, configured such that a wiring layer in which wires made of a metal such as a copper (Cu) foil are provided is provided on an insulating base member made of a material such as a glass epoxy resin. It is assumed here that the wiring board 10 is a two-layer printed wiring board in which a wiring layer is provided on a front surface side and a rear surface side of a base member. One example of a base member made of a glass epoxy resin is FR-4, which has a thickness of approximately 100 μm and has thermal conductivity of approximately 0.4 W/m·K. Note that thermal conductivity of copper (Cu) is approximately 360 W/m·K. The thermal conductivity is a value at 25° C. unless otherwise specified. The base member of the wiring board 10 is an example of a second base member.

The heat releasing base member 100 is constituted by an insulating base member that has higher thermal conductivity than the wiring board 10. For example, the thermal conductivity of the heat releasing base member 100 is preferably 10 W/m·K or more, more preferably 50 W/m·K or more, still more preferably 100 W/m·K or more. A material having thermal conductivity of 10 W/m·K or more is, for example, alumina ($Al_2O_3$) having thermal conductivity of 20 W/m·K to 30 W/m·K. A material having thermal conductivity of 50 W/m·K or more is, for example, silicon nitride ($Si_3N_4$) having thermal conductivity of approximately 85 W/m·K. A material having thermal conductivity of 100 W/m·K or more is, for example, aluminum nitride (AlN) having thermal conductivity of 150 W/m·K to 250 W/m·K. These materials are sometimes referred to as ceramic materials. That is, the whole heat releasing base member 100 is desirably made of a ceramic material. In a case where the heat releasing base member 100 is made of a ceramic material, a heat releasing effect is higher than in a case where the heat releasing base member 100 is made of a resin material. The heat releasing base member 100 may be made of an insulating material of other kinds having high thermal conductivity such as silicon (Si) doped with no impurity. The heat releasing base member 100 is an example of a first base member.

It is assumed here that the heat releasing base member 100, the light diffusion member 30, and the holding unit 60 have identical external shape. Accordingly, outer edges of the heat releasing base member 100, the light diffusion member 30, and the holding unit 60 overlap. Note that the outer edge of the heat releasing base member 100 may be larger than the outer edge of the light diffusion member 30 and the outer edge of the holding unit 60. Conversely, the outer edge of the heat releasing base member 100 may be smaller than the outer edge of the light diffusion member 30 and the outer edge of the holding unit 60. In this case, the holding unit 60 need just be provided on the front surface of the wiring board 10.

The heat releasing base member 100 has a planar shape having a longitudinal direction and a lateral direction. Although the planar shape of the heat releasing base member 100 is, for example, rectangular in FIG. 6A, the planar shape of the heat releasing base member 100 may be a polygonal or oval shape having a longitudinal direction and a lateral direction. Note that a planar shape having a longitudinal direction and a lateral direction is sometimes referred to as an elongated shape. In FIG. 6A, the longitudinal direction and the lateral direction of the heat releasing base member 100 are the y direction and the x direction, respectively. It is assumed that the heat releasing base member 100 has a width Wh1 in the longitudinal direction and has a width Wh2 in the lateral direction (Wh1 is larger than Wh2). The width Wh1 in the longitudinal direction and the width Wh2 in the lateral direction of the heat releasing base member 100 are, for example, 1 mm to 30 mm. The heat releasing base member 100 has a thickness of 100 μm to 500 μm. A center (a center of the width Wh1 in the longitudinal direction and a center of the width Wh2 in the lateral direction) of the heat releasing base member 100 is referred to as a center Oh. The width Wh1 in the longitudinal direction and the width Wh2 in the lateral direction of the heat releasing base member 100 may be identical to each other.

One side (−y direction side) in the longitudinal direction, the other side (+y direction side) in the longitudinal direction, one side (−x direction side) in the lateral direction, and the other side (+x direction side) in the lateral direction of the heat releasing base member 100 are referred to as a side surface 101A, a side surface 101B, a side surface 102A, and a side surface 102B, respectively. The side surface 101A and the side surface 101B face each other. The side surface 102A and the side surface 102B connect the side surface 101A and the side surface 101B and face each other.

As illustrated in FIG. 6A, in the light-emitting device 4, the driving unit 50 is on a line extended from the lateral direction (x direction) of the heat releasing base member 100. This means that the driving unit 50 is disposed beside, in the lateral direction, of the heat releasing base member 100 so as to be located away from the heat releasing base member 100. The driving unit 50 is provided within the range of the width in the longitudinal direction of the heat releasing base member 100. That is, the driving unit 50 is provided within a range between a draw-out line (101A') drawn out toward the driving unit 50 from an end on the one side (−y direction side) in the longitudinal direction of the heat releasing base member 100 and a draw-out line (101B') drawn out toward the driving unit 50 from an end on the other side (+y direction side) in the longitudinal direction of the heat releasing base member 100. This shortens a distance between the light source 20 and the driving unit 50, thereby making the light source 20 and the driving unit 50 close to each other. Note that the driving unit 50 may be provided so as to partially overlap the range between the draw-out line (101A') drawn out toward the driving unit 50 from the heat releasing base member 100 and the draw-out line (101B') drawn out toward the driving unit 50 from the heat releasing base member 100.

Furthermore, the center Ov of the light source 20 is deviated toward the driving unit 50 from the center Oh of the heat releasing base member 100. Note that "deviated" means that the center Ov of the light source 20 is provided closer to the driving unit 50 than the center Oh of the heat releasing base member 100. Note that the center Oh of the heat releasing base member 100, the center Ov of the light source 20, and a center (not illustrated) of the driving unit 50 need not necessarily aligned on a straight line. That is, the center Ov of the light source 20 need just be provided closer to the driving unit 50 than the center Oh of the heat releasing base member 100 in the lateral direction (x direction) of the heat releasing base member 100. This shortens a distance between the light source 20 and the driving unit 50. From the viewpoint of heat release, the light source 20 is desirably disposed at the center Oh of the heat releasing base member 100, but deviating the light source 20 from the center Oh of the heat releasing base member 100 has small influence on heat release since the heat releasing base member 100 has high thermal conductivity. In this example, to shorten a rise time of light emission of the light source 20, the light source 20 is deviated toward the driving unit 50 from the center Oh of the heat releasing base member 100 so that the driving circuit becomes short.

An anode wire 112F is provided on a side far from the driving unit 50 on the front surface of the heat releasing base member 100. That is, the anode wire 112F is deviated away from the driving unit 50 from the center Oh of the heat releasing base member 100.

The capacitors 70A and 70B are disposed so as to sandwich the light source 20 in the longitudinal direction (the ±y directions) of the heat releasing base member 100. That is, an area of the rectangular heat releasing base member 100 is effectively used by disposing the capacitors 70A and 70B in the longitudinal direction of the heat releasing base member 100. Centers Oca and Och of the capacitors 70A and 70B are deviated toward the driving unit 50 from the center Oh of the heat releasing base member 100, as in the case of the light source 20. Note that the light source 20 and the centers Oca and Ocb of the capacitors 70A and 70B need not necessarily be aligned on a straight line. The centers Oca and Ocb of the capacitors 70A and 70B need just be deviated toward the driving unit 50. This shortens distances between the light source 20 and the capacitors 70A and 70B, thereby making the light source 20 and the capacitors 70A and 70B close to each other.

As illustrated in FIG. 6A, the holding unit 60 includes a wall (indicated by the broken line) that surrounds the light source 20 and the capacitors 70A and 70B. As illustrated in FIG. 6B, the holding unit 60 holds the light diffusion member 30 by this wall. That is, the light diffusion member 30 is provided so as to be spaced apart by a predetermined distance from the light source 20 and the capacitors 70A and 70B provided on the heat releasing base member 100 by the holding unit 60. The light diffusion member 30 is provided so as to cover the light source 20 and the capacitors 70A and 70B. Covering the light source 20 with the light diffusion member 30 means that the light diffusion member 30 is provided on an emission path of light emitted by the light source 20 so that the light emitted by the light source 20 passes through the light diffusion member 30. This state is a state in which the light source 20 and the light diffusion member 30 overlap each other in top view seen through the light diffusion member 30 from the front surface side of the light diffusion member 30.

The light diffusion member 30 may be provided so as to cover only the light source 20. That is, a part covering the capacitors 70A and 70B may be a lid-like member made of a similar member to the holding unit 60. In a case where the light diffusion member 30 covers only the light source 20, an area of the expensive light diffusion member 30 is reduced, and cost for the light-emitting device 4 is reduced accordingly.

The holding unit 60 is, for example, a member that is molded from a material such as a resin. The holding unit 60 is desirably colored, for example, in black to absorb light emitted from the light source 20. As a result, light emitted toward the holding unit 60 by the light source 20 is absorbed by the holding unit 60. This keeps the object to be measured from being irradiated with light that has passed through the holding unit 60 and light reflected by the holding unit 60.

Plural wires are provided on front surface sides and rear surface sides of the wiring board 10 and the heat releasing base member 100. These wires will be described later with reference to FIGS. 7 and 8. Note that the wires are conductive patterns connected to an electric circuit, and shapes thereof are not limited.

As described above, the light source 20 is provided on the front surface of the heat releasing base member 100. The heat releasing base member 100 is provided on the front surface of the wiring board 10. This allows heat generated from the light source 20 to be efficiently released. Since a substrate that constitutes the wiring board 10 has low thermal conductivity, the light source 20 is provided on the front surface of the heat releasing base member 100 having higher thermal conductivity than the wiring board 10, as described above.

Figure 7A:
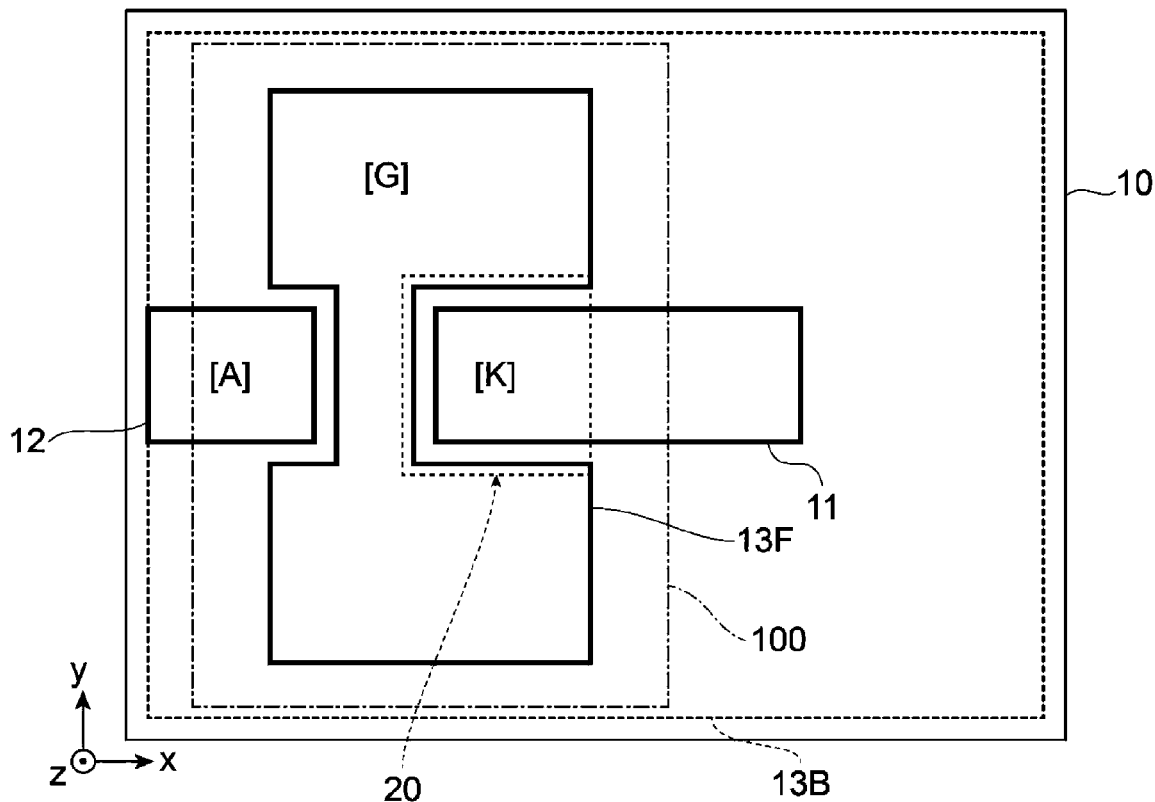
FIGS. 7A through 7C are views for explaining wires provided on the wiring board and wires provided on the heat releasing base member.
Figure 7B:
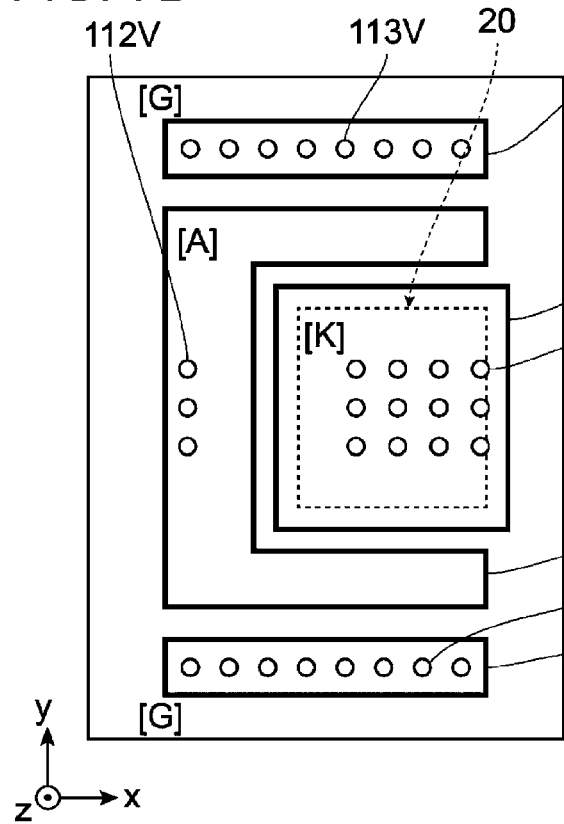
Figure 7C:
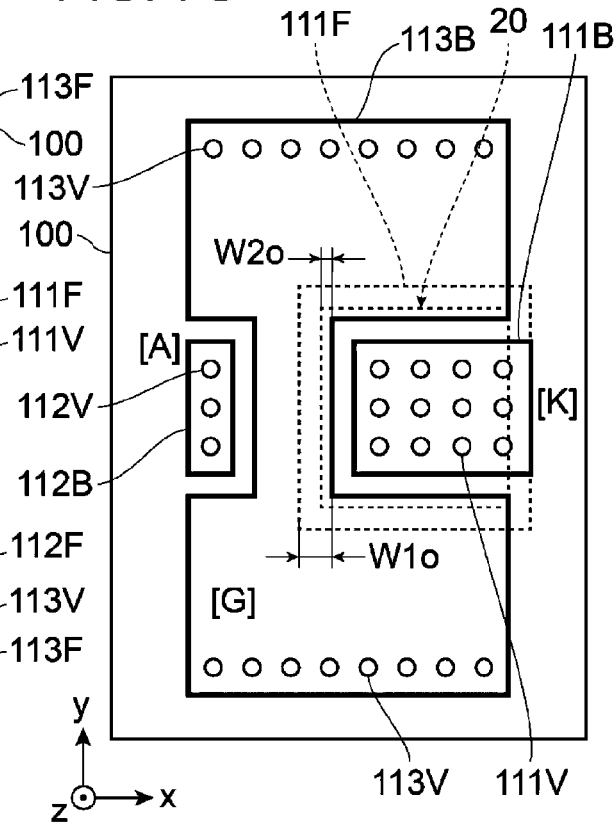

FIGS. 7A through 7C are views for explaining wires provided on the wiring board 10 and wires provided on the heat releasing base member 100. FIG. 7A illustrates wires provided on the wiring board 10, FIG. 7B illustrates wires provided on the front surface side of the heat releasing base member 100, and FIG. 7C illustrates wires provided on the rear surface side of the heat releasing base member 100. The x, y, and z directions illustrated in FIGS. 7A, 7B, and 7C are identical to the x, y, and z directions illustrated in FIGS. 6A and 6B. Accordingly, FIG. 7C illustrates the wires provided on the rear surface side of the heat releasing base member 100 viewed from the front surface side of the heat releasing base member 100, and the wires provided on the front surface of the heat releasing base member 100 illustrated in FIG. 7B and the heat releasing base member 100 are removed from FIG. 7C. A part connected to the cathode electrode 214 of the light source 20, a part connected to the anode electrode 218, and a part to which a reference potential is supplied are indicated by [K], [A], and [G], respectively.

First, the wires provided on the wiring board 10 illustrated in FIG. 7A are described. In FIG. 7A, the external shape of the heat releasing base member 100 is indicated by the line with alternate long and short dashes.

In FIG. 7A, the wires provided on the front surface side of the wiring board 10 are indicated by the solid lines, and the wire provided on the rear surface side of the wiring board 10 is indicated by the broken line. Specifically, a cathode wire 11, an anode wire 12, and a reference potential wire 13F that are insulated from one another are provided on the front surface side of the wiring board 10.

The cathode wire 11 has a rectangular planar shape, and an end thereof on the +x direction side is connected to the driving unit 50, and an end thereof in the −x direction side is connected to the cathode electrode 214 of the light source 20 with the heat releasing base member 100 interposed therebetween (see FIGS. 6A and 6B).

The anode wire 12 has a rectangular planar shape, and an end thereof on the +x direction side is connected to the anode electrode 218 of the light source 20 with the heat releasing base member 100 interposed therebetween, and an end thereof in the −x direction side is connected to the +side of the power source 82. The anode wire 12, the reference potential wire 13F, and the cathode wire 11 are aligned in the x direction. The reference potential wire 13F extends in the ty directions beyond the cathode wire 11 and the anode wire 12, and extended parts thereof are expanded in the +x directions.

A reference potential wire 13B is provided on the rear surface side of the wiring board 10. The reference potential wire 13F provided on the front surface side of the wiring board 10 and the reference potential wire 13B provided on the rear surface of the wiring board 10 are electrically connected to each other by an electrically-conductive through conductor 13V (see FIG. 6B). The reference potential is supplied to the reference potential wire 13B provided on the rear surface side. That is, the reference potential is supplied to the reference potential wire 13F provided on the front surface from the reference potential wire 13B provided on the rear surface side. In this example, the reference potential wire 13B is provided on the whole rear surface of the wiring board 10. An area of the reference potential wire 13B is set larger than an area of the cathode wire 11 and an area of the anode wire 12. In general, a reference wire provided on the rear surface of the wiring board 10 is often provided over a wide area on the rear surface to stabilize a potential of the wire provided on the front surface. In FIG. 7A, illustration of the through conductor 13V is omitted. The through conductor 13V is made of a metal such as copper (Cu) and therefore has high thermal conductivity. The same applies to a through conductor (later described) provided in the heat releasing base member 100. Note that a through conductor is also called a via.

Next, the wires provided on the heat releasing base member 100 illustrated in FIGS. 7B and 7C are described.

As illustrated in FIG. 7B, a cathode wire 111F, an anode wire 112F, and two reference potential wires 113F that are insulated from one another are provided on the front surface side of the heat releasing base member 100. The cathode electrode 214 side of the light source 20 is mounted on a front surface of the cathode wire 111F (see FIG. 6B). The anode wire 112F is provided so as to surround three sides (one side in the lateral direction (the −x direction) and sides in the longitudinal direction (the ty direction) of the heat releasing base member 100) of the cathode wire 111F. The anode wire 112F is connected to the anode electrode 218 of the light source 20 by bonding wires 23A and 23B on the side surfaces 21A and 21B sides (the ty direction sides) of the light source 20 (see FIG. 6A). The two reference potential wires 113F are provided on ty direction sides of the anode wire 112F.

As illustrated in FIG. 7C, a cathode wire 111B, an anode wire 112B, and a reference potential wire 113B that are insulated from one another are provided on the rear surface side of the heat releasing base member 100. In FIG. 7C, the cathode wire 111F illustrated in FIG. 7A is indicated by the broken line.

The cathode wire 111B is provided so as to face the cathode wire 111F provided on the front surface side of the heat releasing base member 100 with the heat releasing base member 100 interposed therebetween. An area of the cathode wire 111B is set smaller than an area of the cathode wire 111F. The cathode wire 111F and the cathode wire 111B are connected to each other through a through conductor 111V. The anode wire 112B is provided so as to face a part of an end, on the −x direction side, of the anode wire 112F provided on the front surface side of the heat releasing base member 100 with the heat releasing base member 100 interposed therebetween. That is, an area of the anode wire 112B is smaller than an area of the anode wire 112F. The anode wire 112F and the anode wire 112B are electrically connected to each other by a through conductor 112V.

The reference potential wire 113B is provided between the cathode wire 111B and the anode wire 112B and extends in the longitudinal direction (the ty directions) of the heat releasing base member 100 beyond the cathode wire 111B and the anode wire 112B. Ends of the reference potential wire 113B in the longitudinal direction (the ty directions) of the heat releasing base member 100 are provided so as to face the two reference potential wires 113F provided on the front surface side of the heat releasing base member 100 with the heat releasing base member 100 interposed therebetween. The reference potential wires 113F and the reference potential wire 113B are electrically connected to each other by a through conductor 113V at ends in the longitudinal direction (the ty directions).

As described above, the cathode wire 111F and the cathode wire 111B that are provided on the front surface side and the rear surface side of the heat releasing base member 100, respectively and are electrically connected to each other have different shapes. Similarly, the anode wire 112F and the anode wire 112B that are provided on the front surface side and the rear surface side of the heat releasing base member 100, respectively and are electrically connected to each other have different shapes. Similarly, the reference potential wires 113F and the reference potential wire 113B that are provided on the front surface side and the rear surface side of the heat releasing base member 100, respectively and are electrically connected to each other have different shapes. As illustrated in FIG. 7C, edge parts of the reference potential wire 113B and edge parts of the cathode wire 111F indicated by the broken line overlap on the ty direction sides and the −x direction side in top view. The cathode wire 111F and the reference potential wire 113B overlap each other by an overlapping width W1o. Edge parts of the reference potential wire 113B and edge parts of the light source 20 indicated by the broken line also overlap on the sides in the longitudinal direction (+y direction) and the one side in the lateral direction (−x direction) of the heat releasing base member 100. The cathode wire 111F and the light source 20 overlap each other by an overlapping width W2o. Each of the overlapping widths W1o and W2o is the same on the sides in the longitudinal direction (±y direction) and the one side in the lateral direction (−x direction) of the heat releasing base member 100.

An area of the reference potential wire 113B provided on the rear surface side of the heat releasing base member 100 is set larger than an area of the cathode wire 111F and an area of the anode wire 112F provided on the front surface side of the heat releasing base member 100. The area of the reference potential wire 113B is set so as to encompass the capacitors 70A and 70B. That is, the capacitors 70A are 70B are included within the reference potential wire 113F in top view. Note that the area of the reference potential wire 113B provided on the rear surface side of the heat releasing base member 100 may be set larger than either the area of the cathode wire 111F or the area of the anode wire 112F provided on the front surface side of the heat releasing base member 100.

Figure 8:
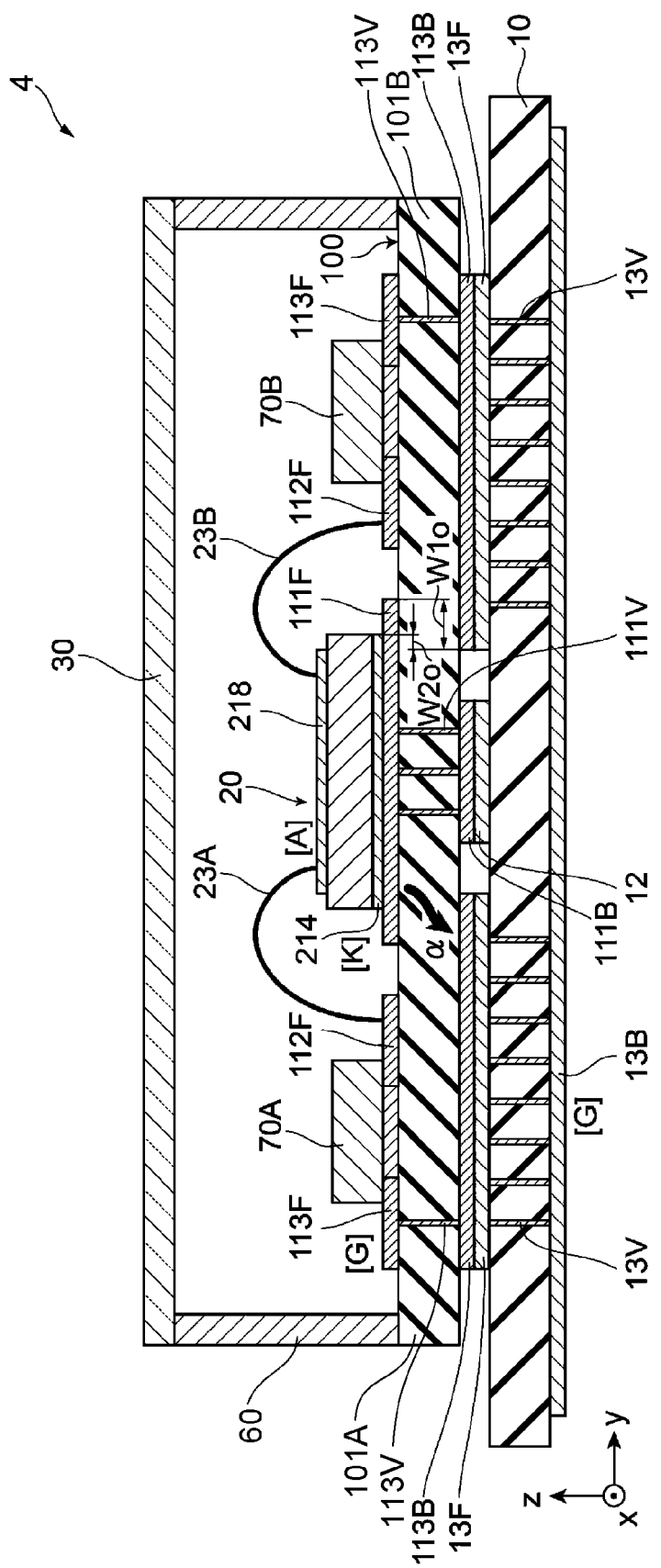
FIG. 8 is a view for further explaining a light-emitting device to which the present exemplary embodiment is applied.

FIG. 8 is a view for further explaining the light-emitting device 4 to which the present exemplary embodiment is applied. FIG. 8 is a cross-sectional view of the light-emitting device 4 taken along line VIII-VIII of FIG. 6A.

An electric connection relationship in the light-emitting device 4 is described with reference to FIGS. 6A, 6B, 7A, 7B, 7C, and 8.

As described above, the heat releasing base member 100 is provided on the front surface of the wiring board 10, and the light source 20 and the capacitors 70A and 70B are provided on the front surface of the heat releasing base member 100.

The cathode wire 11 provided on the front surface side of the wiring board 10 is connected to the driving unit 50 (see FIGS. 6A and 6B). The cathode wire 11 is connected to the cathode wire 111B provided on the rear surface side of the heat releasing base member 100, for example, by solder. The cathode wire 111B is connected to the cathode wire 111F provided on the front surface side of the heat releasing base member 100 through the through conductor 111V provided in the heat releasing base member 100. The light source 20 is mounted on the cathode wire 111F, and the cathode wire 111F is connected to the cathode electrode 214 of the light source 20 (see FIGS. 6B and 8). The cathode wire 11 is set short since the light source 20 is deviated toward the driving unit 50 on the heat releasing base member 100 (see FIGS. 6A and 6B).

The anode wire 12 provided on the front surface side of the wiring board 10 is connected to the anode wire 112B provided on the rear surface side of the heat releasing base member 100, for example, by solder. The anode wire 112B is connected to the anode wire 112F provided on the front surface side of the heat releasing base member 100 through the through conductor 112V provided in the heat releasing base member 100. The anode wire 112F is connected to the anode electrode 218 of the light source 20 through the bonding wires 23A and 23B (see FIGS. 6A and 6B).

The reference potential wire 13F provided on the front surface side of the wiring board 10 is connected to the reference potential wire 13B provided on the rear surface side of the wiring board 10 through the through conductor 13V (see FIGS. 6B and 8). The reference potential wire 13F is connected to the reference potential wire 113B provided on the rear surface of the heat releasing base member 100, for example, by solder (FIGS. 6B and 8). The reference potential wire 13B is connected to the two reference potential wires 113F provided on the front surface side of the heat releasing base member 100 through the through conductor 113V provided in the heat releasing base member 100. Each of the capacitors 70A and 70B is disposed between one of the reference potential wires 113F and the anode wire 112F. Specifically, the capacitor 70A is provided between and is electrically connected to one, on the one side in the longitudinal direction (the −y direction side) of the heat releasing base member 100, of the two reference potential wires 113F and the anode wire 112F. Similarly, the capacitor 70B is provided between and is electrically connected to one, on the other side in the longitudinal direction (the +y direction side), of the two reference potential wires 113F and the anode wire 112F (see FIGS. 6A and 8).

The anode wire 112B provided on the rear surface side of the heat releasing base member 100 has a smaller area than the reference potential wire 113B. An electric current flows (electric charge is supplied) from the power source 82 (see FIG. 5) to the anode wire 112B, and the capacitors 70A and 70B are thus charged. Accordingly, the anode wire 112B need just connect the anode wire 12 provided on the front surface of the wiring board 10 and the anode wire 112F provided on the front surface of the heat releasing base member 100 in a direct-current manner and may have large circuit inductance. That is, a circuit that charges the capacitors 70A and 70B may be longer than the driving circuit through which an electric current for light emission of the light source 20 flows.

Next, a path for releasing heat generated by the light source 20 in the light-emitting device 4 to which the present exemplary embodiment is applied is described with reference to FIG. 8.

As described above, the light source 20 generates a large amount of heat. Accordingly, heat generated by the light source 20 needs to be easily released. As described above, a metal such as copper (Cu) used as a material of a wire has high thermal conductivity. For example, thermal conductivity of copper (Cu) is approximately 360 W/m·K, which is much higher than approximately 0.4 W/m·K of a base member used as the wiring board 10. Accordingly, heat generated by the light source 20 is desirably released to an outside, for example, from a housing through the reference potential wire 13B provided on the rear surface side of the wiring board 10. In particular, the reference potential wire 13B has a larger area than the cathode wire 11 and the anode wire 12 provided on the front surface side of the wiring board 10. Accordingly, heat is easily released by transferring the heat to the reference potential wire 13B. That is, it is desirable to release the heat generated by the light source 20 to the reference potential wire 13B provided on the rear surface of the wiring board 10 at a short distance.

As illustrated in FIG. 8, the cathode electrode 214 of the light source 20 is provided on the cathode wire 111F provided on the front surface side of the heat releasing base member 100. Meanwhile, the anode electrode 218 of the light source 20 is connected to the anode wire 112F provided on the front surface side of the heat releasing base member 100 by the bonding wires 23A and 23B. Accordingly, paths (hereinafter referred to as heat releasing paths) along which heat generated by the light source 20 (hereinafter referred to as heat) is transferred include a path from the cathode electrode 214 to the cathode wire 111F, a path from the anode electrode 218 to the anode wire 112F through the bonding wires 23A and 23B, and a path to a space (air) around the light source 20. However, the heat is hard to transfer along the path to the bonding wires 23A and 23B and the heat releasing path to a space (air) around the light source 20. Accordingly, the heat generated by the light source 20 is transferred along the heat releasing path from the cathode electrode 214 to the cathode wire 111F.

As described above, thermal conductivity of the heat releasing base member 100 is 10 W/m·K or more, which is higher than approximately 0.4 W/m·K of a substrate used as the wiring board 10. Accordingly, the heat transfers from the anode wire 112F to the cathode wire 111B, the anode wire 112B, and the reference potential wire 113B provided on the rear surface side of the heat releasing base member 100 through the heat releasing base member 100. However, the cathode wire 111B and the anode wire 112B are connected to the cathode wire 11 and the anode wire 12 of the wiring board 10, respectively. Neither the cathode wire 11 nor the anode wire 12 is connected to the reference potential wire 13B. That is, heat is released from the cathode wire 11 and the anode wire 12 through the base member of the wiring board 10. However, the base member of the wiring board 10 has low thermal conductivity, as described above.

Meanwhile, the reference potential wire 113F is connected to the reference potential wire 13F provided on the front surface side of the wiring board 10, and the reference potential wire 13F is connected to the reference potential wire 13B provided on the rear surface side of the wiring board 10 through the through conductor 13V. Accordingly, heat that transfers to the reference potential wire 113B provided on the rear surface side of the heat releasing base member 100 transfers to the reference potential wire 13B through the reference potential wire 13F and the through conductor 13V (path a in FIG. 8).

As described above, in the light-emitting device 4 to which the present exemplary embodiment is applied, heat generated by the light source 20 is released along a heat releasing path passing the cathode wire 111F provided on the front surface side of the heat releasing base member 100, the heat releasing base member 100, the reference potential wire 113B provided on the rear surface side of the heat releasing base member 100, the reference potential wire 13F provided on the front surface of the wiring board 10, the through conductor 13V, and the reference potential wire 13B provided on the rear surface side of the wiring board 10 in this order.

The reference potential wire 113B provided on the rear surface side of the heat releasing base member 100 and the cathode wire 111F provided on the front surface side of the heat releasing base member 100 are provided so as to overlap each other by the overlapping width W1o in top view. This shortens a heat releasing path along which heat transfers from the cathode wire 111F to the reference potential wire 113B. Furthermore, the reference potential wire 113B provided on the rear surface side of the heat releasing base member 100 and the light source 20 are provided so as to overlap each other by the overlapping width W2o in top view. This further shortens a heat releasing path along which heat transfers from the light source 20 to the reference potential wire 113B. With these configurations, heat generated by the light source 20 is easily released. For this reason, an area of the cathode wire 111B provided on the rear surface side of the heat releasing base member 100 is set smaller than an area of the cathode wire 111F provided on the front surface side of the heat releasing base member 100.

The heat transfers from the cathode wire 111F to the reference potential wire 113B through the heat releasing base member 100 having high thermal conductivity, as long as the cathode wire 111F is provided on the front surface side of the heat releasing base member 100 and the reference potential wire 113B is provided on the rear surface side of the heat releasing base member 100. Accordingly, the reference potential wire 113B and the cathode wire 111F need not necessarily overlap each other in top view. Similarly, the reference potential wire 113B and the light source 20 need not necessarily overlap each other in top view.

As described above, the heat generated by the light source 20 is released to the reference potential wire 13B provided on the rear surface side of the wiring board 10 through the heat releasing base member 100 having high thermal conductivity. Accordingly, heat generated by the light source 20 is more easily released than in a case where heat is released through the wiring board 10 having thermal conductivity lower than the heat releasing base member 100.

Next, a driving circuit through which a driving electric current for causing the VCSELs (the light source 20) to emit light flows is described.

The driving electric current flows from the capacitor 70A to the anode electrode 218 of the VCSELs (the light source 20) through the anode wire 112F of the heat releasing base member 100 and the bonding wire 23A. Then, the driving electric current flows from the cathode electrode 214 of the VCSELs (the light source 20) to the MOS transistor 51 (see FIG. 6) of the driving unit 50 through the cathode wire 111F, the through conductor 111V, and the cathode wire 111B of the heat releasing base member 100, and the cathode wire 11 of the wiring board 10. Next, the driving electric current returns from the MOS transistor 51 of the driving unit 50 to the capacitor 70A through the reference potential wire 13B, the through conductor 13V, and the reference potential wire 13F of the wiring board 10 and the reference potential wire 113B, the through conductor 113V, and the reference potential wire 113F of heat releasing base member 100. The same applies to the capacitor 70B.

The driving circuit becomes shorter as a distance from the capacitors 70A and 70B to the VCSELs (the light source 20) becomes shorter. This reduces the circuit inductance, thereby shortening a rise time of light emission of the VCSELs. In the light-emitting device 4 to which the present exemplary embodiment is applied, the distance from the capacitors 70A and 70B to the light source 20 is set short since the light source 20 and the capacitors 70A and 70B are provided on the front surface of the heat releasing base member 100. The capacitors 70A and 70B generate a smaller amount of heat than the light source 20. It is therefore unnecessary to consider heat release even in a case where the capacitors 70A and 70B are provided on the front surface side of the heat releasing base member 100. Note that it is desirable not to provide the driving unit 50 on the heat releasing base member 100 since the driving unit 50 generates a large amount of heat.

Next, a light-emitting device 4' to which the present exemplary embodiment is not applied is described for comparison.

Figure 9A:
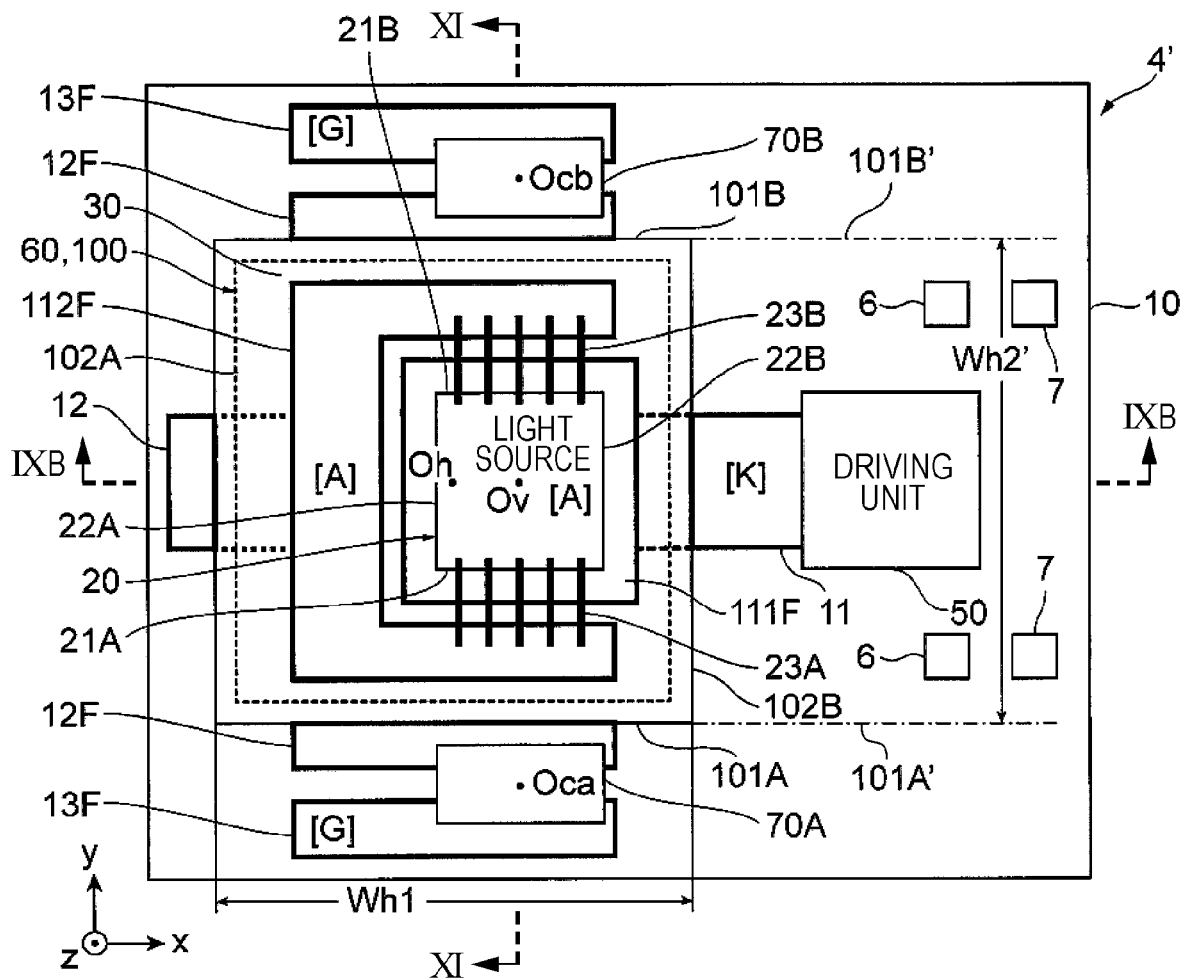
FIGS. 9A and 9B are views for explaining a light-emitting device to which the present exemplary embodiment is not applied.
Figure 9B:
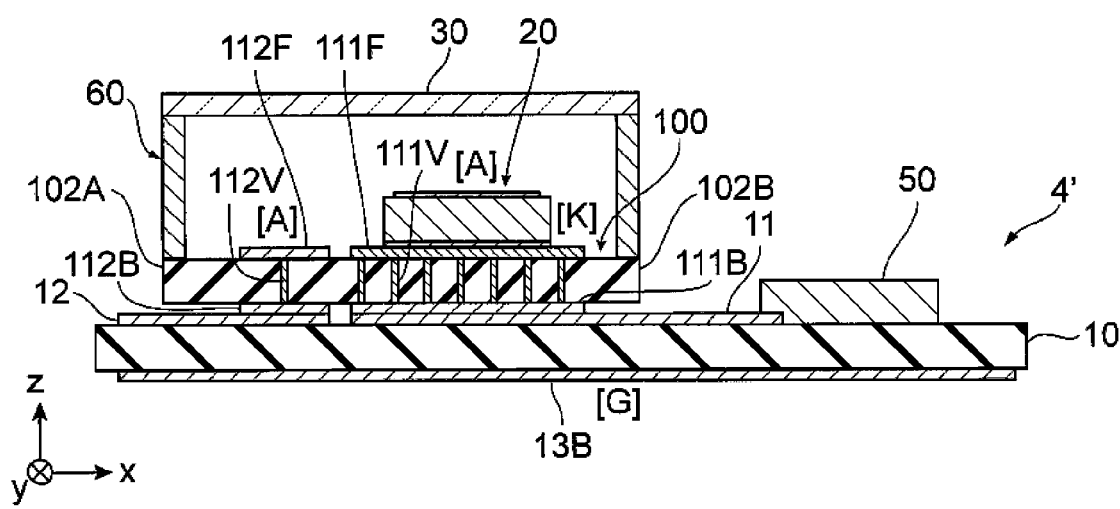

FIGS. 9A and 9B are views for explaining the light-emitting device 4' to which the present exemplary embodiment is not applied. FIG. 9A is a plan view, and FIG. 9B is a cross-sectional view taken along line IXB-IXB of FIG. 9A. Parts of the light-emitting device 4' that have identical functions to those of the light-emitting device 4 are given identical reference signs even if these parts have shapes different from those of the light-emitting device 4. In the following description, description of parts similar to those of the light-emitting device 4 is omitted, and differences are described.

As illustrated in FIG. 9A, the light-emitting device 4' has capacitors 70A and 70B on a wiring board 10 and a light source 20 on a front surface of a heat releasing base member 100. That is, the capacitors 70A and 70B are provided outside the heat releasing base member 100. A holding unit 60 is provided on the front surface of the heat releasing base member 100. That is, a light diffusion member 30 provided on the holding unit 60 covers the light source 20 but does not cover the capacitors 70A and 70B. A planar shape of the heat releasing base member 100 of the light-emitting device 4' is a square shape obtained by shortening the longitudinal direction of the heat releasing base member 100 in the light-emitting device 4 to which the present exemplary embodiment is applied. Since the capacitors 70A and 70B are not provided on the heat releasing base member 100 in the light-emitting device 4', the heat releasing base member 100 need not have a shape having a longitudinal direction and a lateral direction unlike the heat releasing base member 100 of the light-emitting device 4.

In the light-emitting device 4', a center Ov of the light source 20 is deviated toward the driving unit 50 on the heat releasing base member 100 as in the light-emitting device 4. This shortens a distance between the light source 20 and the driving unit 50, thereby making the light source 20 and the driving unit 50 close to each other.

Figure 10A:
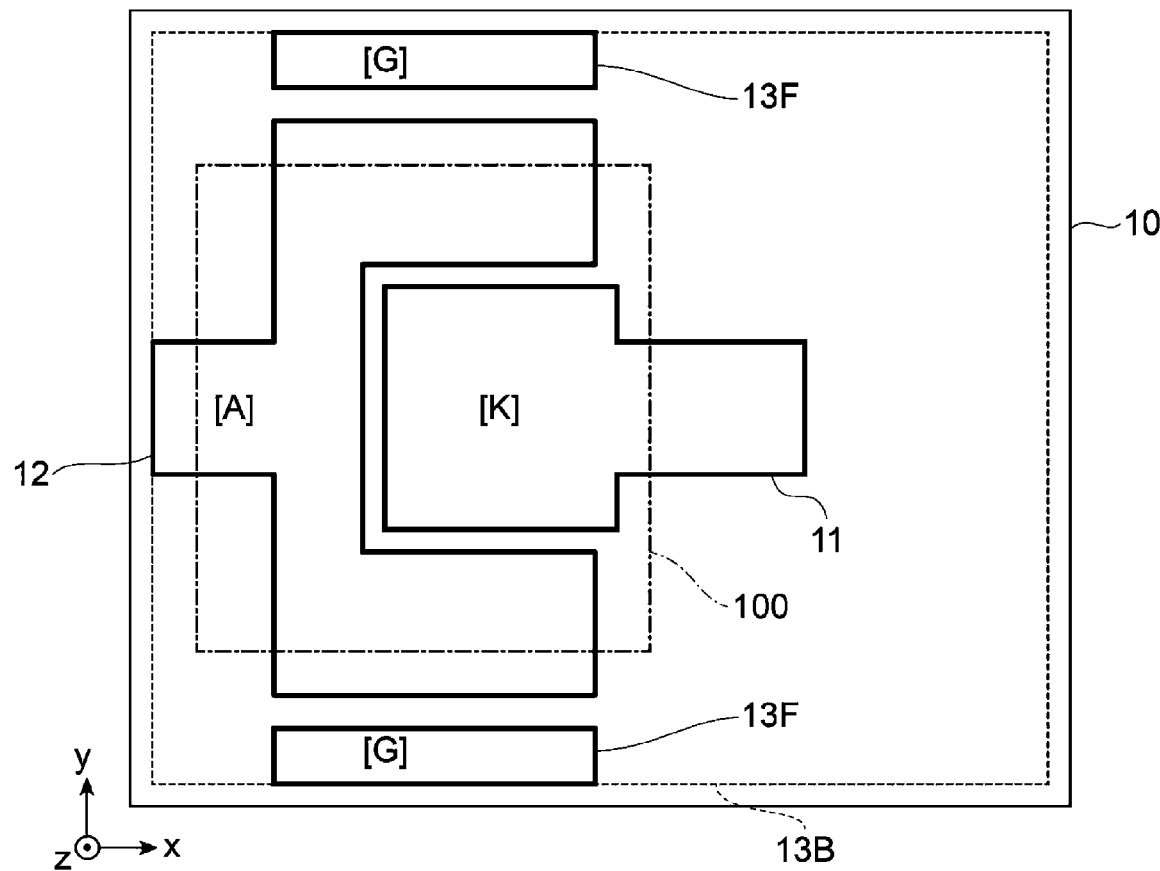
FIGS. 10A through 10C are views for explaining wires provided on a wiring board and wires provided on a heat releasing base member in the light-emitting device to which the present exemplary embodiment is not applied.
Figure 10B:
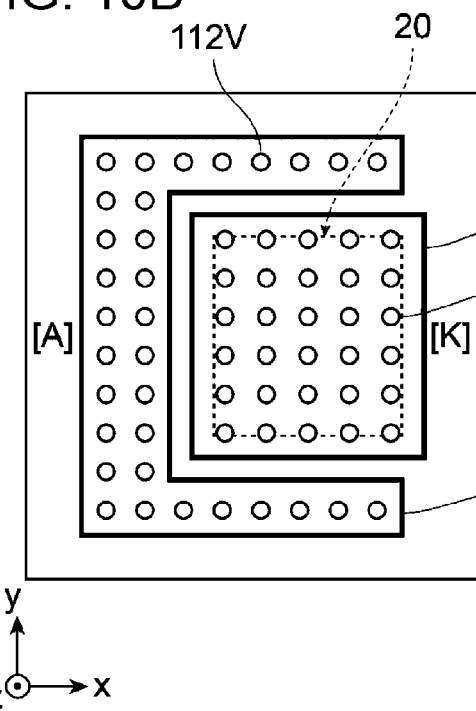
Figure 10C:
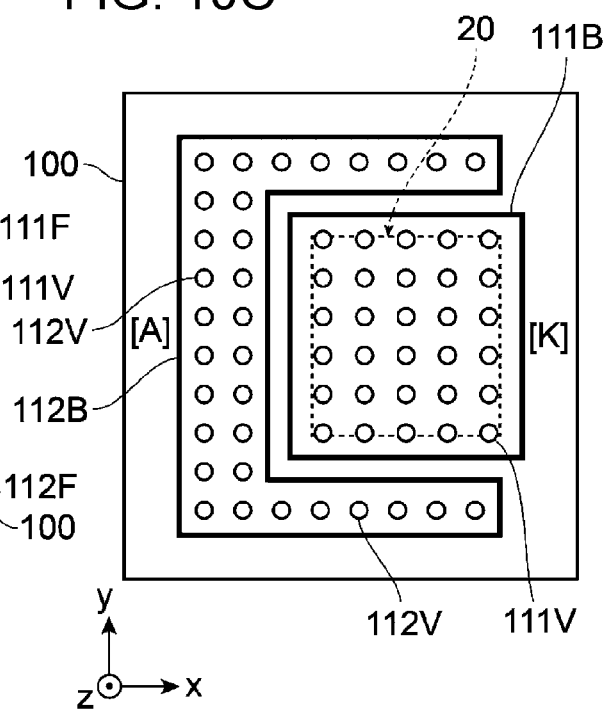

FIGS. 10A through 10C are views for explaining wires provided on the wiring board 10 and wires provided on the heat releasing base member 100 in the light-emitting device 4' to which the present exemplary embodiment is not applied. FIG. 10A illustrates wires provided on the wiring board 10, FIG. 10B illustrates wires provided on the front surface of the heat releasing base member 100, and FIG. 10C illustrates wires provided on a rear surface of the heat releasing base member 100.

First, the wires provided on the wiring board 10 illustrated in FIG. 10A are described. In FIG. 10A, an external shape of the heat releasing base member 100 is indicated by the line with alternate long and short dashes. In FIG. 10A, the wires provided on a front surface side of the wiring board 10 are indicated by the solid lines, and the wire provided on a rear surface side of the wiring board 10 is indicated by the broken line.

A cathode wire 11, an anode wire 12, and reference potential wires 13F that are insulated from one another are provided on the front surface side of the wiring board 10.

The cathode wire 11 is configured such that a planar shape thereof on a −x direction side is quadrangular and an end thereof drawn out on a +x direction side is connected to a driving unit 50. The quadrangular part on the −x direction side is connected to a cathode electrode 214 of the light source 20 through the heat releasing base member 100 (see FIGS. 9A and 9B).

The anode wire 12 is provided so as to surround three sides (the −x direction side and the ±y direction sides) of the cathode wire 11. The part drawn out on the −x direction side is connected to a +side of a power source 82. The anode wire 12 is connected to an anode electrode 218 of the light source 20 through the heat releasing base member 100 and bonding wires 23A and 23B.

The two reference potential wires 13F have a quadrangular planar shape and are provided on the ±y direction sides of the anode wire 12, respectively.

A reference potential wire 13B is provided on the rear surface side of the wiring board 10. The two reference potential wires 13F provided on the front surface of the wiring board 10 and the reference potential wire 13B provided on the rear surface of the wiring board 10 are electrically connected to each other through an electrically conductive through conductor 13V (see FIG. 11, which will be described later). The reference potential wire 13B is provided over the whole rear surface of the wiring board 10.

Next, the wires provided on the heat releasing base member 100 illustrated in FIGS. 10B and 10C are described.

As illustrated in FIG. 10B, a cathode wire 111F and an anode wire 112F that are insulated from each other are provided on the front surface side of the heat releasing base member 100. A cathode electrode 214 side of the light source 20 is mounted on a front surface of the cathode wire 111F (see FIG. 9B). The anode wire 112F is provided so as to surround three sides (the −x direction side and the ±y direction sides) of the cathode wire 111F. The anode wire 112F is connected to the anode electrode 218 of the light source 20 by the bonding wires 23A and 23B on the ±y direction sides (see FIG. 9A).

As illustrated in FIG. 10C, a cathode wire 111B and an anode wire 112B that are insulated from each other are provided on the rear surface side of the heat releasing base member 100. Planar shapes of the cathode wire 111B and the anode wire 112B are identical to those of the cathode wire 111F and the anode wire 112F provided on the front surface side of the heat releasing base member 100 illustrated in FIG. 10B.

The cathode wire 111F and the cathode wire 111B are connected to each other through a through conductor 111V. The anode wire 112F and the anode wire 112B are electrically connected to each other through a through conductor 112V.

As described above, the reference potential wires 113F and 113B, which are provided on the heat releasing base member 100 of the light-emitting device 4, are not provided on the heat releasing base member 100 of the light-emitting device 4'.

Figure 11:
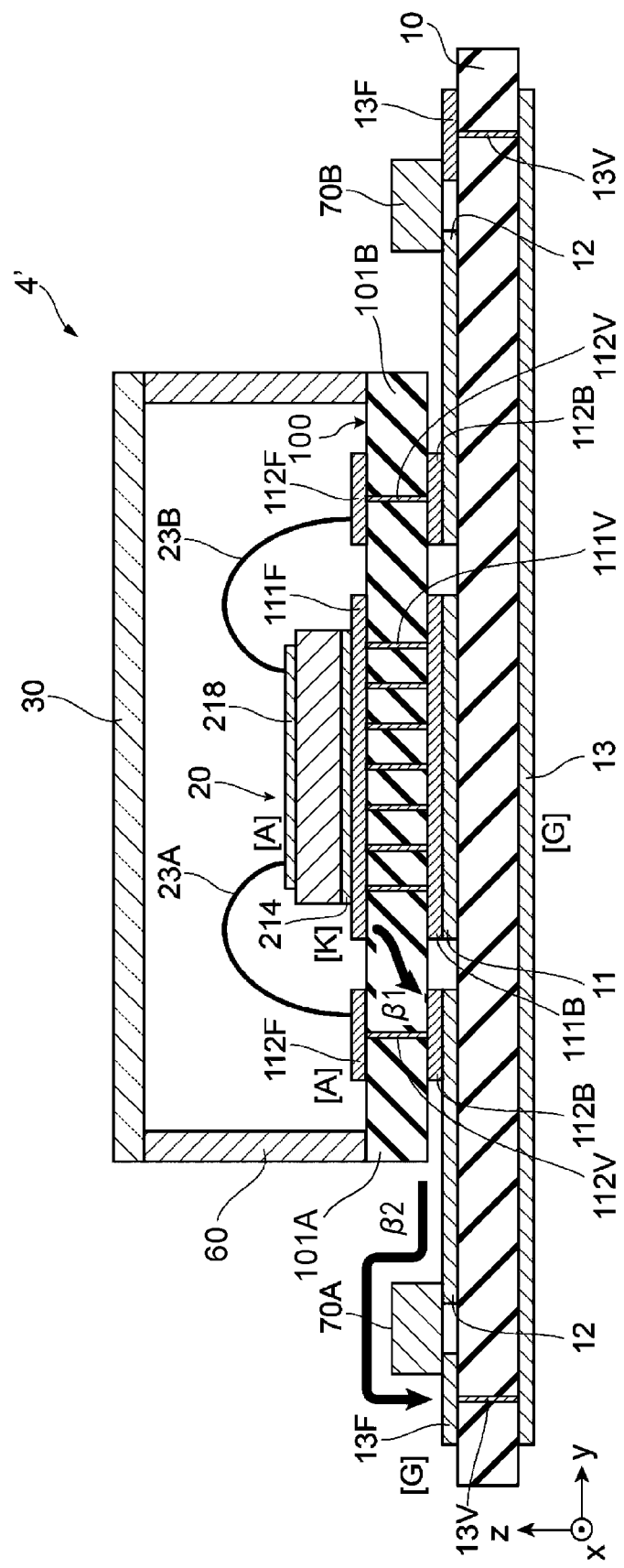
FIG. 11 is a view for further explaining a light-emitting device to which the present exemplary embodiment is not applied.

FIG. 11 is a view for further explaining the light-emitting device 4' to which the present exemplary embodiment is not applied. FIG. 11 is a cross-sectional view of the light-emitting device 4' of FIG. 9A taken along line XI-XI.

An electric connection relationship in the light-emitting device 4' is described with reference to FIGS. 9A, 9B, 10A, 10B, 10C, and 11.

As described above, the heat releasing base member 100 is provided on the front surface of the wiring board 10, and the light source 20 is provided on the front surface of the heat releasing base member 100. The capacitors 70A and 70B are provided on the front surface of the wiring board 10.

The cathode wire 11 provided on the front surface side of the wiring board 10 is connected to the driving unit 50 (see FIGS. 9A and 9B). The cathode wire 11 is connected to the cathode wire 111B provided on the rear surface side of the heat releasing base member 100, for example, by solder. The cathode wire 111B is connected to the cathode wire 111F provided on the front surface of the heat releasing base member 100 through the through conductor 111V provided in the heat releasing base member 100. The light source 20 is mounted on the cathode wire 111F, which is connected to the cathode electrode 214 of the light source 20 (see FIGS. 9B and 11).

The anode wire 12 provided on the front surface side of the wiring board 10 is connected to the anode wire 112B provided on the rear surface side of the heat releasing base member 100, for example, by solder. The anode wire 112B is connected to the anode wire 112F provided on the front surface side of the heat releasing base member 100 through a through conductor 112V provided in the heat releasing base member 100. The anode wire 112F is connected to the anode electrode 218 of the light source 20 through the bonding wires 23A and 23B (see FIG. 9A and 11).

The reference potential wires 13F provided on the front surface side of the wiring board 10 are connected to the reference potential wire 13B provided on the rear surface side of the wiring board 10 through a through conductor 13V (see FIGS. 9B and 11). Each of the capacitors 70A and 70B is disposed between the reference potential wire 13F and the anode wire 12 on the wiring board 10. That is, as illustrated in FIG. 10A, the capacitor 70A is electrically connected between the reference potential wire 13F on the −y side of the wiring board 10 and the anode wire 12. Similarly, the capacitor 70B is electrically connected between the reference potential wire 13F on the +y side of the wiring board 10 and the anode wire 12.

Next, a heat releasing path along which heat generated by the light source 20 is released in the light-emitting device 4' is described with reference to FIG. 11.

As described above, heat generated by the light source 20 transfers along a path from the cathode electrode 214 of the light source 20 to the cathode wire 111F provided on the heat releasing base member 100. The heat transfers to the cathode wire 111B and the anode wire 112B provided on the rear surface of the heat releasing base member 100 through the heat releasing base member 100. Furthermore, the heat transfers from the cathode wire 111B and the anode wire 112B to the cathode wire 11 and the anode wire 12 provided on the front surface side of the wiring board 10. However, thermal conductivity of the wiring board 10 is smaller than that of a metal such as copper (Cu), as described above. Accordingly, the heat transfers from the anode wire 12 provided on the front surface side of the wiring board 10 to the reference potential wires 13F through the capacitors 70A and 70B (path β1 in FIG. 11). Then, the heat transfers from the reference potential wires 13F to the reference potential wire 13B provided on the rear surface side of the wiring board 10 through the through conductor 13V (path β2 in FIG. 11).

As described above, in the light-emitting device 4', heat generated by the light source 20 is released along a heat releasing path passing the cathode wire 111F provided on the front surface side of the heat releasing base member 100, the heat releasing base member 100, the anode wire 112B provided on the rear surface side of the heat releasing base member 100, the anode wire 112F provided on the front surface side of the wiring board 10, the capacitors 70A and 70B, the reference potential wires 13F, and the through conductor 13V, and the reference potential wire 13B provided on the rear surface side of the wiring board 10 in this order. That is, in the light-emitting device 4', the heat is hard to transfer to the reference potential wire 13B provided on the rear surface side of the wiring board 10 although the heat releasing base member 100 having high thermal conductivity is used. This inhibits transfer of heat from the light source 20.

In the light-emitting device 4 to which the present exemplary embodiment is applied, the reference potential wires 113F and 113B are provided on the heat releasing base member 100. This creates a heat releasing path along which heat generated by the light source 20 transfers to the reference potential wire 13B provided on the rear surface side of the wiring board 10 through the reference potential wire 13F provided on the front surface side of the wiring board 10 and the through conductor 13V provided in the wiring board 10.

Meanwhile, in the light-emitting device 4', the reference potential wires 113F and 113B are not provided on the heat releasing base member 100. Accordingly, a heat releasing path along which heat generated by the light source 20 transfers to the reference potential wire 13B provided on the rear surface side of the wiring board 10 is hard to be formed.

Next, a driving circuit along which a driving electric current for causing the light source 20 to emit light flows in the light-emitting device 4' to which the present exemplary embodiment is not applied is described.

The driving electric current flows from the capacitor 70A to the anode electrode 218 of the light source 20 (VCSELs) through the anode wire 12 of the wiring board 10, the anode wire 112B of the heat releasing base member 100, the through conductor 112V, the anode wire 112F, and the bonding wire 23A. The driving electric current flows from the cathode electrode 214 of the light source 20 (VCSELs) to an MOS transistor 51 (see FIG. 6) of the driving unit 50 through the cathode wire 111F, the through conductor 111V, and the cathode wire 111B of the heat releasing base member 100 and the cathode wire 11 of the wiring board 10. Next, the driving electric current returns from the MOS transistor 51 of the driving unit 50 to the capacitor 70A through the reference potential wire 13B, the through conductor 13V, and the reference potential wire 13F of the wiring board 10. The same applies to the capacitor 70B.

In the light-emitting device 4', the capacitors 70A and 70B are provided on the front surface of the wiring board 10, and the light source 20 is provided on the front surface of the heat releasing base member 100. Accordingly, a distance from the capacitors 70A and 70B to the light source 20 is larger than that in the light-emitting device 4 to which the present exemplary embodiment is applied. Accordingly, the light-emitting device 4' is large in circuit inductance of the driving circuit even though the light source 20 is deviated toward the driving circuit 50 on the heat releasing base member 100 so that the light source 20 and the driving unit 50 become close to each other. Therefore, a rise time of light emission of the VCSELs in the light-emitting device 4' is longer than that in the light-emitting device 4.

That is, in the light-emitting device 4 to which the present exemplary embodiment is applied, the light source 20 and the capacitors 70A and 70B are provided on the front surface of the heat releasing base member 100, and therefore a distance from the capacitors 70A and 70B to the light source 20 is set short. This shortens a rise time of light emission of the light source 20. Note that at least part of one or both of the capacitors 70A and 70B may be embedded in the heat releasing base member 100.

As described above, in the light-emitting device 4 to which the present exemplary embodiment is applied, the reference potential wires 113F and 113B are provided on the heat releasing base member 100, and therefore a heat releasing path along which heat generated by the light source 20 transfers to the reference potential wire 13B provided on the rear surface side of the wiring board 10 through the reference potential wire 13F provided on the front surface side of the wiring board 10 and the through conductor 13V provided in the wiring board 10 is formed. As illustrated in FIG. 8, it is only necessary that heat generated by the light source 20 transfer to the reference potential wire 113B provided on the rear surface side of the heat releasing base member 100, and therefore it is only necessary that the reference potential wire 113B be provided on the rear surface side of the heat releasing base member 100.

Although the heat releasing base member 100 and the driving unit 50 are provided on the front surface of the wiring board 10 in the light-emitting device 4 to which the present exemplary embodiment is applied, the heat releasing base member 100 and the driving unit 50 may be provided on different circuit boards that are connected, for example, by a flexible flat cable (FFC) or a flexible printed circuit (FPC).

Furthermore, in the light-emitting device 4 to which the present exemplary embodiment is applied, the heat releasing base member 100 may be silicon (Si), which is a semiconductor substrate, the driving unit 50 may be configured as a driving IC by silicon (Si), and the capacitors 70 may be provided on the driving IC. The light source 20 including VCSELs may be flip-chip-connected. This reduces a space where the light-emitting device is disposed as compared with a case where the driving unit 50 is provided separately from the heat releasing base member 100.

In the light-emitting device 4 to which the present exemplary embodiment is applied, the light diffusion member 30 for outputting incident light after changing a spread angle of the incident light to a larger angle by diffusion is used as an example of an optical member. The optical member may be, for example, a diffractive optical element (DOE) for outputting incident light after changing a direction of the incident light to a different direction. Alternatively, the optical member may be a transparent member such as a light focusing lens, a microlens, or a protection cover.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
   a first base member;
   a laser unit provided on the first base member, wherein the laser unit is a surface emitting laser element array;
   a capacitive element that is provided on the first base member and supplies a driving electric current to the laser unit;
   a wiring board that is constituted by a second base member having lower thermal conductivity than the first base member and on which the first base member is mounted; and
   a driving unit that is mounted on the wiring board and drives the laser unit.

2. The light-emitting device according to claim 1, wherein
   a planar shape of the first base member has a lateral direction and a longitudinal direction; and
   the driving unit is mounted on a line extended from the lateral direction so that at least part thereof overlaps a range of a width in the longitudinal direction.

3. The light-emitting device according to claim 2, wherein the driving unit is mounted on the line extended from the lateral direction so that the whole driving unit is within the range of the width in the longitudinal direction.

4. The light-emitting device according to claim 2, wherein the laser unit and the capacitive element are aligned in the longitudinal direction.

5. The light-emitting device according to claim 3, wherein the laser unit and the capacitive element are aligned in the longitudinal direction.

6. The light-emitting device according to claim 1, wherein the laser unit is deviated toward the driving unit from a center of the first base member.

7. The light-emitting device according to claim 2, wherein the laser unit is deviated toward the driving unit from a center of the first base member.

8. The light-emitting device according to claim 3, wherein the laser unit is deviated toward the driving unit from a center of the first base member.

9. The light-emitting device according to claim 4, wherein the laser unit is deviated toward the driving unit from a center of the first base member.

10. The light-emitting device according to claim 5, wherein
    the laser unit is deviated toward the driving unit from a center of the first base member.

11. The light-emitting device according to claim 6, wherein
    the capacitive element is deviated toward the driving unit from the center of the first base member.

12. The light-emitting device according to claim 7, wherein
    the capacitive element is deviated toward the driving unit from the center of the first base member.

13. The light-emitting device according to claim 8, wherein
    the capacitive element is deviated toward the driving unit from the center of the first base member.

14. The light-emitting device according to claim 1, wherein
    the first base member is made of a ceramic material.

15. The light-emitting device according to claim 1, wherein
    the first base member is a semiconductor substrate; and
    the driving unit that drives the laser unit is provided in the semiconductor substrate.

16. The light-emitting device according to claim 1, further comprising an optical member that changes at least one of a direction and a spread angle of light emitted from the laser unit.

17. An optical device comprising:
    the light-emitting device according to claim 1; and
    a light receiving unit that receives light emitted from the laser unit of the light-emitting device and then reflected by an object to be measured,
    wherein the light receiving unit outputs a signal corresponding to a period from the emission of the light from the laser unit to the reception of the light by the light receiving unit.

18. A measurement device that measures a three-dimensional shape of an object to be measured, comprising:
    the optical device according to claim 17; and
    a three-dimensional shape specifying unit that specifies the three-dimensional shape of the object to be measured on a basis of light emitted from the laser unit of the optical device, reflected by the object to be measured, and then received by the light receiving unit of the optical device.

* * * * *